United States Patent
Cadouri et al.

(10) Patent No.: US 7,904,852 B1
(45) Date of Patent: Mar. 8, 2011

(54) METHOD AND SYSTEM FOR IMPLEMENTING PARALLEL PROCESSING OF ELECTRONIC DESIGN AUTOMATION TOOLS

(75) Inventors: Eitan Cadouri, Cupertino, CA (US); Krzysztof A. Kozminski, San Jose, CA (US); Haifang Liao, San Jose, CA (US); Kenneth Mednick, San Jose, CA (US); Roland Ruehl, San Carlos, CA (US); Mark A. Snowden, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/225,853

(22) Filed: Sep. 12, 2005

(51) Int. Cl.
*G06F 17/50* (2006.01)

(52) U.S. Cl. ............ 716/52; 716/51; 716/112; 716/124; 716/125; 703/19; 703/22

(58) Field of Classification Search .................. 716/4–7, 716/51, 52, 112, 124, 125; 703/19, 22
See application file for complete search history.

(56) References Cited

U.S. PATENT DOCUMENTS

| | | | |
|---|---|---|---|
| 5,299,139 A | 3/1994 | Baisuck et al. | |
| 5,339,415 A | 8/1994 | Strout et al. | |
| 5,440,720 A | 8/1995 | Baisuck et al. | |
| 5,537,329 A | 7/1996 | Feldmann et al. | |
| 5,559,718 A | 9/1996 | Baisuck et al. | |
| 5,581,475 A | 12/1996 | Majors | |
| 5,613,102 A | 3/1997 | Chiang et al. | |
| 5,812,415 A | 9/1998 | Baisuck | |
| 5,828,880 A | 10/1998 | Hannko | |
| 5,870,313 A * | 2/1999 | Boyle et al. | 716/10 |
| 6,003,066 A | 12/1999 | Ryan et al. | |
| 6,009,250 A * | 12/1999 | Ho et al. | 716/5 |
| 6,035,107 A | 3/2000 | Kuehlmann et al. | |
| 6,047,116 A | 4/2000 | Murakami et al. | |
| 6,066,179 A | 5/2000 | Allan | |
| 6,185,583 B1 | 2/2001 | Blando | |
| 6,237,128 B1 | 5/2001 | Folberth et al. | |
| 6,289,369 B1 | 9/2001 | Sundaresan | |
| 6,324,673 B1 | 11/2001 | Luo et al. | |
| 6,389,451 B1 | 5/2002 | Hart | |
| 6,401,240 B1 | 6/2002 | Summers | |
| 6,505,327 B2 | 1/2003 | Lin | |
| 6,519,749 B1 | 2/2003 | Chao et al. | |
| 6,536,028 B1 * | 3/2003 | Katsioulas et al. | 716/17 |
| 6,560,766 B2 | 5/2003 | Pierrat et al. | |

(Continued)

OTHER PUBLICATIONS

"A compensation-based scheduling scheme for Grid Computing", by Y.M. Teo, X. Wang, and J.P. Gozali, Proceeding of the 7th International Conference on High Performance Computing and Grid, pp. 334-342, IEEE Computer Society Press, Tokyo, Japan, Jul. 20-22, 2004.*

(Continued)

*Primary Examiner* — Paul Dinh
*Assistant Examiner* — Nha T Nguyen
(74) *Attorney, Agent, or Firm* — Vista IP Law Group LLP

(57) ABSTRACT

Disclosed is an improved method and system for processing the tasks performed by an EDA tool in parallel. The IC layout is divided into a plurality of layout windows and one or more of the layout windows are processed in parallel. Sampling of one or more windows may be performed to provide dynamic performance estimation.

60 Claims, 17 Drawing Sheets

U.S. PATENT DOCUMENTS

| | | | |
|---|---|---|---|
| 6,574,788 B1 | 6/2003 | Levine et al. | |
| 6,629,293 B2 | 9/2003 | Chang et al. | |
| 6,701,504 B2 | 3/2004 | Chang et al. | |
| 6,721,928 B2 | 4/2004 | Pierrat et al. | |
| 6,738,954 B1 | 5/2004 | Allen et al. | |
| 6,829,757 B1 | 12/2004 | Teig et al. | |
| 6,996,790 B2 | 2/2006 | Chang | |
| 7,047,506 B2 | 5/2006 | Neves et al. | |
| 7,051,307 B2* | 5/2006 | Ditlow et al. | 716/7 |
| 7,089,511 B2 | 8/2006 | Allen et al. | |
| 7,107,559 B2 | 9/2006 | Lakshmanan et al. | |
| 7,155,698 B1 | 12/2006 | Gennari | |
| 7,177,859 B2 | 2/2007 | Pather et al. | |
| 7,266,795 B2 | 9/2007 | Baumgartner et al. | |
| 7,318,214 B1 | 1/2008 | Prasad et al. | |
| 7,340,742 B2 | 3/2008 | Tabuchi | |
| 7,401,208 B2 | 7/2008 | Kalla et al. | |
| 7,421,505 B2 | 9/2008 | Berg | |
| 7,500,240 B2 | 3/2009 | Shoemaker et al. | |
| 7,526,740 B2 | 4/2009 | Bohl et al. | |
| 2001/0003843 A1* | 6/2001 | Scepanovic et al. | 716/7 |
| 2002/0049956 A1* | 4/2002 | Bozkus et al. | 716/4 |
| 2002/0162085 A1 | 10/2002 | Zolotykh et al. | |
| 2003/0012147 A1 | 1/2003 | Buckman et al. | |
| 2003/0014471 A1 | 1/2003 | Ohsawa et al. | |
| 2003/0014473 A1 | 1/2003 | Ohsawa et al. | |
| 2003/0018684 A1 | 1/2003 | Ohsawa et al. | |
| 2003/0023939 A1 | 1/2003 | Pierrat et al. | |
| 2003/0033509 A1 | 2/2003 | Leibholz et al. | |
| 2003/0037117 A1 | 2/2003 | Tabuchi | |
| 2004/0006584 A1 | 1/2004 | Vandeweerd | |
| 2004/0015256 A1* | 1/2004 | Conrad et al. | 700/121 |
| 2004/0019679 A1 | 1/2004 | Sandhya et al. | |
| 2004/0019892 A1 | 1/2004 | Sandhya et al. | |
| 2004/0044979 A1* | 3/2004 | Aji et al. | 716/13 |
| 2004/0098511 A1 | 5/2004 | Lin et al. | |
| 2004/0187112 A1 | 9/2004 | Potter | |
| 2004/0199887 A1* | 10/2004 | Jain et al. | 716/5 |
| 2004/0215932 A1 | 10/2004 | Burky et al. | |
| 2004/0215939 A1 | 10/2004 | Armstrong | |
| 2004/0216101 A1 | 10/2004 | Burky et al. | |
| 2004/0268354 A1 | 12/2004 | Kanai et al. | |
| 2005/0038852 A1 | 2/2005 | Howard | |
| 2005/0091634 A1* | 4/2005 | Gallatin et al. | 716/21 |
| 2005/0097561 A1 | 5/2005 | Schumacher et al. | |
| 2005/0102681 A1 | 5/2005 | Richardson | |
| 2005/0132320 A1 | 6/2005 | Allen et al. | |
| 2005/0138474 A1* | 6/2005 | Jain et al. | 714/30 |
| 2005/0166173 A1 | 7/2005 | Cote et al. | |
| 2005/0216870 A1 | 9/2005 | DeCamp et al. | |
| 2005/0216875 A1* | 9/2005 | Zhang et al. | 716/9 |
| 2005/0262510 A1 | 11/2005 | Parameswaran et al. | |
| 2006/0005154 A1 | 1/2006 | Cobb et al. | |
| 2006/0062430 A1 | 3/2006 | Vallone et al. | |
| 2006/0123420 A1 | 6/2006 | Nishikawa | |
| 2006/0200825 A1 | 9/2006 | Potter | |
| 2006/0230370 A1 | 10/2006 | Baumgartner et al. | |
| 2006/0253813 A1 | 11/2006 | Rittman | |
| 2006/0265675 A1* | 11/2006 | Wang | 716/5 |
| 2007/0079268 A1 | 4/2007 | Jones et al. | |
| 2007/0192545 A1 | 8/2007 | Gara et al. | |
| 2007/0220232 A1 | 9/2007 | Rhoades et al. | |
| 2007/0233805 A1 | 10/2007 | Grodd et al. | |
| 2007/0271562 A1 | 11/2007 | Schumacher et al. | |
| 2009/0125867 A1 | 5/2009 | Cote et al. | |

OTHER PUBLICATIONS

"Overhead Analysis of a Dynamic Load Balancing Library for Cluster Computing" by Ioana Banicescu, Ricolindo L. Cari~no, Jaderick P. Pabico*, and Mahadevan Balasubramaniam†, Proceedings of the 19th IEEE International Parallel and Distributed Processing Symposium (IPDPS'05), @2005.*

Palace: A Parallel and Hierarchical Layout Analyzer and Circuit Extractor by F. Scherber, E Barke, and W. Meier, @1996 IEEE.*

"Largest-Job-First-Scan-All Scheduling Policy for 2D Mesh-Connected Systems", by Seong-Moo Yoo and Hee Yong Youn, @1996 by IEEE.*

Office Action dated Apr. 4, 2008 for U.S. Appl. No. 11/520,487.

Notice of Allowance dated Mar. 11, 2008 for U.S. Appl. No. 11/225,815.

Office Action dated Apr. 8, 2008 for U.S. Appl. No. 11/225,816.

Bender, M.A. et al. "On-the-Fly Maintenance of Series-Parallel Relationships in Fork-Join Multithreaded Programs" Proceedings of the 16th Annual ACM Symposium on Parallelism in Algorithms and Architectures, Barcelona, Spain, 2004, pp. 133-144.

Cadence Design Systems, Inc. "Assura layout vs. Schematic Verifier" 2003, 4 pgs., Cadence Design Systems, Inc. San Jose CA.

Ferguson, J. "Calibre MTflex: Reducing the High Cost of Porcessing Power", Mar. 2004, 5 pgs., Mentor Graphics Corporation, San Jose, CA.

Fliesler, M. "Mentor Consulting Helps AMD Win Another Race to Market", 2001, pp. 1-5, Mentor Graphics Corporation, San Jose, CA.

Krishnaswamy, V. et al. "Actor Based Parallel VHDL Simulation Using TimeWarp" Proccedings of the 10th Workshop on Parallel and Distributed Simulation, 1996, pp. 135-142.

Lee, P.M. et al. "A Parallel and Accelerated Circuit Simulator with Precise Accuracy" Proceedings of the 15th International Conference on VLSI Design (VLSI '02), Bangalore, India, Jan. 7-11, 2002, pp. 1-6.

Magarshack, P. et al. "System-on-chip Beyond the Nanometer Wall" Proceedings of the 40th Conference on Design Automation (DAC '03), Anaheim, CA, Jun. 2-6, 2003, pp. 419-424.

Mentor Graphics Corporation "Mentor Graphics Unveils Calibre MTflex to Combat Cost of Nanometer Design Compute Requirements", May 12, 2003, 2 pages, Mentor Graphics Corporation, San Jose, CA.

Mentor Graphics Corporation "Calibre LVS: Precise IC Layout Verification with the Schematic Design", 2005, 4 pags., Mentor Graphics Corporation, San Jose, CA.

Prabhu, A.M. "Management Issues in EDA" Proceedings of the 31st Conference on Design Automation (DAC '94), San Diego, CA, Jun. 6-10, 1994, pp. 41-47.

Saavedra-Barrera, R.H. et al. "Analysis of Multithreaded Architectures for Parallel Computing" Proceedings of the Second Annual ACM Symposium on Parallel Algorithms and Architectures (SPAA '90), Island of Crete, Greece, 1990, pp. 169-178.

Schellenberg, F. "Mask EDA Workshop" Copyright 1999-2001, 47 pgs., Mentor Graphics Corporation, San Jose, CA.

Spiller, M.D. et al. "EDA and the Network" Proceedings of the 1997 IEEE/ACM International Conference on Computer-Aided Design (CAD '97), San Jose, CA 1997, pp. 470-476.

Office Action dated Jan. 11, 2008 for U.S. Appl. No. 11/228,472.

Office Action dated Aug. 24, 2007 for U.S. Appl. No. 11/228,472.

Office Action dated Jan. 18, 2007 for U.S. Appl. No. 11/228,472.

Office Action dated Sep. 28, 2007 for U.S. Appl. No. 11/225,816.

Office Action dated Sep. 17, 2007 for U.S. Appl. No. 11/225,815.

Final Office Action dated Jan. 8, 2009 for U.S. Appl. No. 11/520,487.

Office Action dated Feb. 18, 2009 for U.S. Appl. No. 11/228,472.

Office Action dated Dec. 18, 2008 for U.S. Appl. No. 11/225,816.

Cadence Design Systems, Inc. "Diva Reference" Product Version 4.4.6, Jun. 2000, Cadence Design Systems, Inc. San Jose CA., part 1 of 14, pp. 1-49.

Cadence Design Systems, Inc. "Diva Reference" Product Version 4.4.6, Jun. 2000, Cadence Design Systems, Inc. San Jose CA., part 2 of 14, pp. 50-99.

Cadence Design Systems, Inc. "Diva Reference" Product Version 4.4.6, Jun. 2000, Cadence Design Systems, Inc. San Jose CA., part 3 of 14, pp. 100-149.

Cadence Design Systems, Inc. "Diva Reference" Product Version 4.4.6, Jun. 2000, Cadence Design Systems, Inc. San Jose CA., part 4 of 14, pp. 150-199.

Cadence Design Systems, Inc. "Diva Reference" Product Version 4.4.6, Jun. 2000, Cadence Design Systems, Inc. San Jose CA., part 5 of 14, pp. 200-249.

Cadence Design Systems, Inc. "Diva Reference" Product Version 4.4.6, Jun. 2000, Cadence Design Systems, Inc. San Jose CA., part 6 of 14, pp. 250-299.

Cadence Design Systems, Inc. "Diva Reference" Product Version 4.4.6, Jun. 2000, Cadence Design Systems, Inc. San Jose CA., part 7 of 14, pp. 300-349.

Cadence Design Systems, Inc. "Diva Reference" Product Version 4.4.6, Jun. 2000, Cadence Design Systems, Inc. San Jose CA., part 8 of 14, pp. 350-399.

Cadence Design Systems, Inc. "Diva Reference" Product Version 4.4.6, Jun. 2000, Cadence Design Systems, Inc. San Jose CA., part 9 of 14, pp. 400-449.

Cadence Design Systems, Inc. "Diva Reference" Product Version 4.4.6, Jun. 2000, Cadence Design Systems, Inc. San Jose CA., part 10 of 14, pp. 450-499.

Cadence Design Systems, Inc. "Diva Reference" Product Version 4.4.6, Jun. 2000, Cadence Design Systems, Inc. San Jose CA., part 11 of 14, pp. 500-549.

Cadence Design Systems, Inc. "Diva Reference" Product Version 4.4.6, Jun. 2000, Cadence Design Systems, Inc. San Jose CA., part 12 of 14, pp. 550-599.

Cadence Design Systems, Inc. "Diva Reference" Product Version 4.4.6, Jun. 2000, Cadence Design Systems, Inc. San Jose CA., part 13 of 14, pp. 600-629.

Cadence Design Systems, Inc. "Diva Reference" Product Version 4.4.6, Jun. 2000, Cadence Design Systems, Inc. San Jose CA., part 14 of 14, pp. 630-658.

Dongarra, J.J. et al. "LAPACK Working Note 37 Two Dimensional Basic Linear Algebra Communication Subprograms" Technical Report University of Tennessee, 1991.

Mohapatra, P. et al. "A Lazy Scheduling Scheme for Hypercube Computers" Journal of Parallel and Distributed Computing 27, 26-27 (1995).

Niewczas, M. et al. "A Pattern Matching Algorithm for Verification and Analysis of Very Large IC Layouts" ISPD 98, Apr. 6-8, 1998, pp. 129-134.

Ousterhout J.K. "Corner Stitching: A Data-Structure Technique fro VLSI Layout Tools" IEEE Transactions on Computer Aided-Design of Integrated Circuits and Systems, vol. CAD-3, No. 1, pp. 97-100, Jan. 1984.

Teo, Y.M. et al. "A compensation-based scheduling scheme for Grid Computing" Proceeding of the 7th International Conference on High Performance Computing and Grid, pp. 334-342, IEEE Computer Society Press, Tokyo, Japan, Jul. 20-22, 2004.

Notice of Allowance dated Mar. 11, 2008 for U.S. Appl. No. 11/225,815.

Kalas, I. et al. "FTL: A Multithreaded Environment for Parallel Computation" Proceedings of the 1994 Conference of the Centre for Advanced Studies on Collaborative Research, Toronto, Ontario, Canada, 1994, pp. 1-12.

Notice of Allowance dated May 29, 2009 for U.S. Appl. No. 11/520,487.

Final Office Action dated Aug. 13, 2009 for U.S. Appl. No. 11/228,472.

Notice of Allowance dated Sep. 18, 2009 for U.S. Appl. No. 11/520,487.

Non-Final Office Action dated Feb. 4, 2010 for U.S. Appl. No. 11/225,816.

Non-Final Office Action dated Jan. 20, 2010 for U.S. Appl. No. 11/228,472.

Final Office Action date Jan. 21, 2010 for U.S. Appl. No. 11/479,600.

Final Office Action dated Aug. 4, 2010 for U.S. Appl. No. 11/228,472.

Non-Final Office Action dated Jul. 21, 2010 for U.S. Appl. No. 11/225,816.

Notice of Allowance dated Nov. 12, 2010 for U.S. Appl. No. 11/228,472.

Non-Final Office Action dated Nov. 24, 2010 for U.S. Appl. No. 11/479,600.

Final Office Action dated Feb. 2, 2011 for U.S. Appl. No. 11/225,816.

\* cited by examiner

Type I
(e.g. Boolean)

Type II
(e.g. sizing – less than window diameter)

Neighbor read

Type III
(e.g. connect, global area calculation)

Global exchange/ Synchronization

Type IV
(sequence of 1st three types; e.g. sizing of more than window diameter)

Local Computation

Data Reads from Neighbors

Global Communication Operations

METHOD AND SYSTEM FOR IMPLEMENTING PARALLEL PROCESSING OF ELECTRONIC DESIGN AUTOMATION TOOLS

BACKGROUND AND SUMMARY

The invention relates to the design and manufacture of integrated circuits, and more particularly, to systems and methods for performing parallel processing of electronic design automation (EDA) tools.

The electronic design process for an integrated circuit (IC) involves describing the behavioral, architectural, functional, and structural attributes of an IC or electronic system. Design teams often begin with very abstract behavioral models of the intended product and end with a physical description of the numerous structures, devices, and interconnections on an IC chip. Semiconductor foundries use the physical description to create the masks and test programs needed to manufacture the ICs. EDA tools are extensively used by designers throughout the process of designing and verifying electronic designs.

A Physical Verification (PV) tool is a common example of a EDA tool that is used by electronics designers. PV is one of the final steps that is performed before releasing an IC design to manufacturing. Physical verification ensures that the design abides by all of the detailed rules and parameters that the foundry specifies for its manufacturing process. Violating a single foundry rule can result in a silicon product that does not work for its intended purpose. Therefore, it is critical that thorough PV processing is performed before finalizing an IC design. Physical Verification tools may be used frequently and at many stages of the IC design process. As noted above, PV tools may be used during design and at tape-out to ensure compliance with physical and electrical constraints imposed by the manufacturing process. In addition, PV tools may also be used after tape-out to verify and ensure manufacturability of the design and its constituent elements.

PV tools read and manipulate a design database which stores information about device geometries and connectivity. Because compliance with design rules generally constitutes the gating factor between one stage of the design and the next, PV tools are typically executed multiple times during the evolution of the design and contribute significantly to the project's critical path. Therefore, reducing PV tool execution time makes a major contribution to the reduction of overall design cycle times.

As the quantity of data in modern IC designs become larger and larger over time, the execution time required to process EDA tools upon these IC designs also becomes greater. For example, the goal of reducing PV tool execution time is in sharp tension with many modern IC designs being produced by electronics companies that are constantly increasing in complexity and number of transistors. The more transistors and other structures on an IC design, the greater amounts of time that is normally needed to perform PV processing. This problem is exasperated for all EDA tools by constantly improving IC manufacturing technologies that can create IC chips at ever-smaller feature sizes, which allows increasingly greater quantities of transistors to be placed within the same chip area, as well resulting in more complex physical and lithographic effects during manufacture.

To improve the processing of EDA tools, the present invention provide an improved method and system for processing the tasks performed by an EDA tool in parallel. In some embodiment of the invention, the IC layout is divided into a plurality of layout windows and one or more of the layout windows are processed in parallel. Methods are described for some embodiments for sampling one or more windows to provide dynamic performance estimation.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of the invention and, together with the Detailed Description, serve to explain the principles of the invention.

DETAILED DESCRIPTION

Disclosed is an improved method and system for implementing parallelism for execution of electronic design automation tools. An example of an EDA tool is a physical verification (PV) tool. Embodiments of the present invention may be illustrated below relative to a description of parallelism for PV tools. It is noted, however, that the present invention is not limited to PV tools, and may also be applied to other types of EDA tools.

Figure 1:
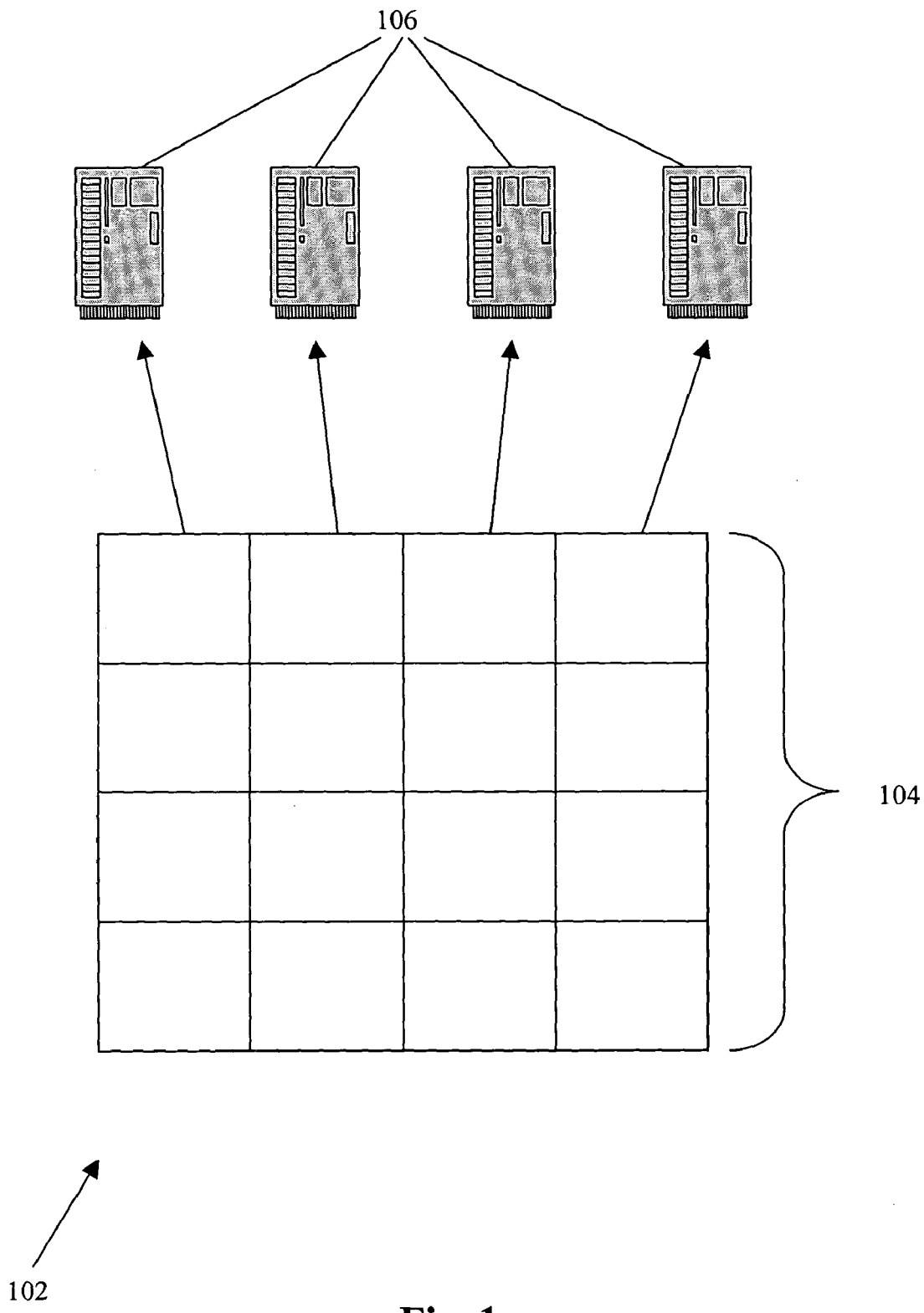
FIGS. 1 and 2 illustrate an IC layout divided into multiple layout windows and being processed by parallel processing entities.

FIG. 1 provides a high-level illustration of an embodiment of the present invention, in which parallelism is provided by dividing an IC layout 102 into a plurality of two-dimensional (2D) "windows" 104. Some or all of the different windows 104 may be processed by the EDA tool in parallel by different processing entities 106. Examples of such processing entities include processes, threads, tasks, CPUs, nodes, and/or networked computing stations.

A layout window 104 may be implemented as a rectangular area of a design layout. The window 104 may itself be a hierarchical layout with multiple layers. Shapes that touch the window boundary are cut into pieces along the window boundary. The pieces inside the boundary remain within the window layout. In alternative embodiments, the window may comprise one or more non-rectangular shapes. The window itself may be non-rectangular.

A design hierarchy has cell masters and cell instances (linear transformations of the master). When a cell master is outside a window, but the window includes instances of this cell master, a new master inside the window is generated that completes the hierarchy of the window's layout. In some embodiments, two approaches are used to deal with cells and instances that intersect the window boundary. In the first approach, all shapes of the intersecting cell/instance are "promoted" to the top-level of the hierarchy, i.e., the instance disappears and shapes inside the window are "flattened". In the second approach, a new cell (a "variant", i.e., a modified copy of the original instance) is created and stored in the design hierarchy instead of the original cell/instance. In yet another approach, the layout is partially flattened, in which only a portion of the hierarchy is promoted to a higher level of the hierarchy or only a portion of the hierarchy is flattened.

This approach can be used to implement "output" partitioning, in which the intended output of some sort of processing (e.g., for an IC design layout to be verified) is partitioned into multiple portions or sections that can be individually operated upon by different processing entities. This is in contrast to "input" partitioning, in which partitioning is performed based solely upon the input data.

Figure 2:
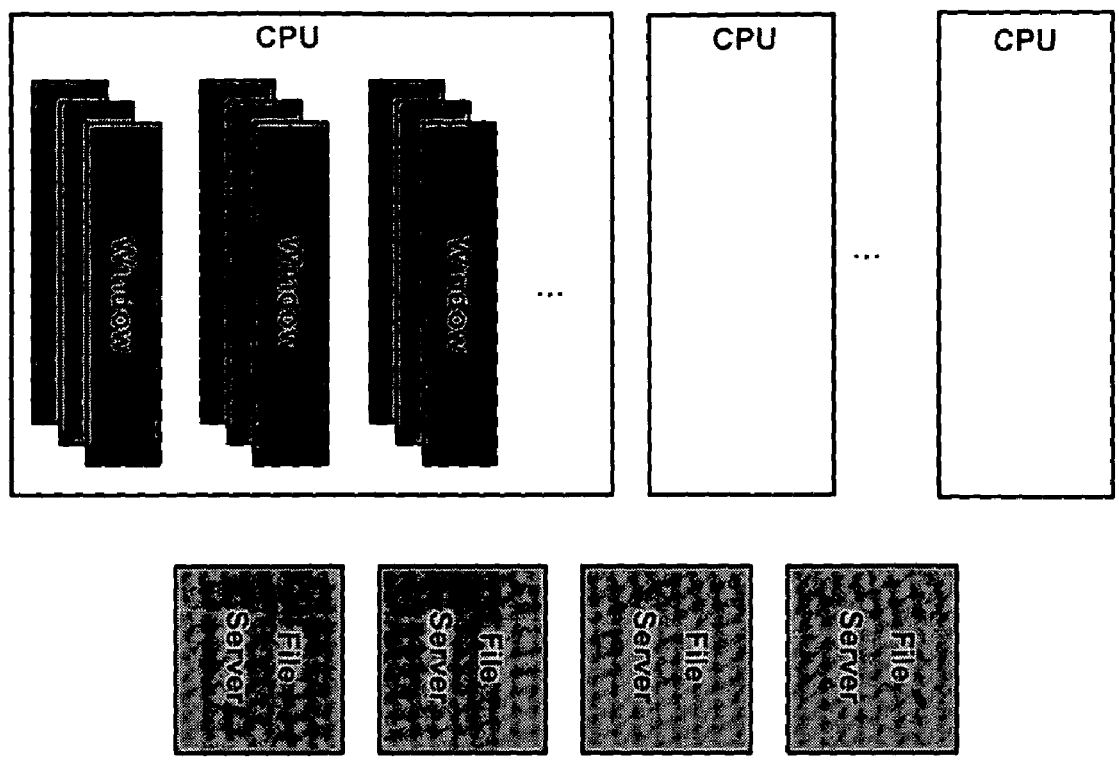

As shown in FIG. 2, window-based parallelism can be implemented by mapping multiple windows to the same CPU. Furthermore, the number of file servers storing the design database and the number of CPUs need not be the same. While the invention supports heterogeneous networks of computers, in one embodiment, the type of computer server best suited to run large PV applications is a symmetrical system. An example is a system of 20 AMD Opteron based compute servers with one local disk and 2 CPUs each.

Figure 3:
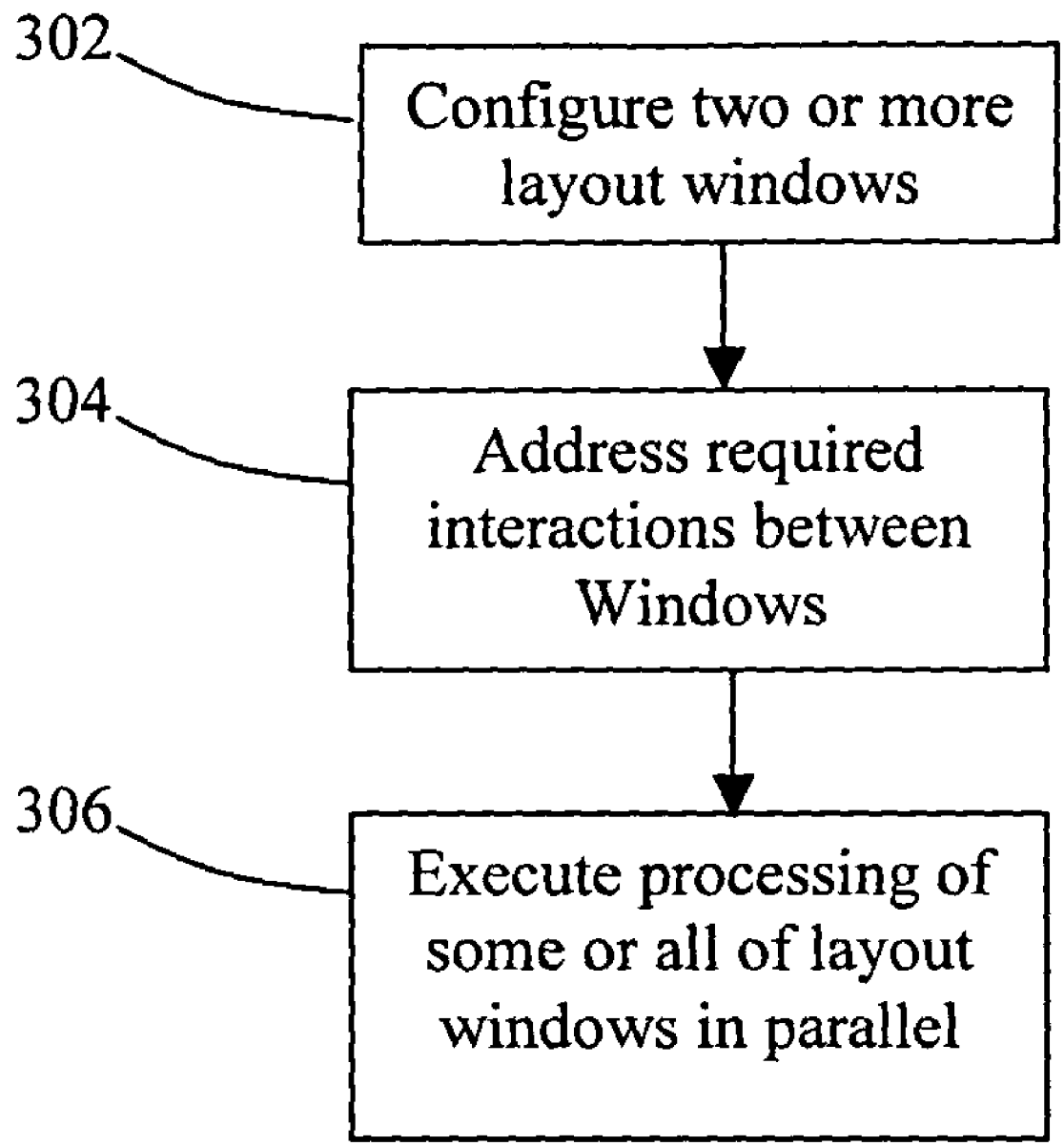
FIG. 3 shows a flow diagram of a process for implementing parallel processing for an EDA tool.

FIG. 3 shows a flowchart of a process for implementing parallelism according to an embodiment of the invention. At 302, the layout is divided into two or more layout windows.

The size, composition, and location of the windows can be selected to meet desired performance expectations. If the layout windows are configured to meet performance expectations, then this may be accomplished by having the user determine a desired timeframe for completing execution of the EDA workload and configuring the layout windows to meet the desired timeframe.

For example, consider a PV tool operation to verify a IC design layout. The IC layout may include many millions of transistors. On a conventional non-parallel PV tool, this verification workload may take at least an overnight run to complete, and may even take over a day to finish processing. The user may determine that the desired timeframe for completing the verification task is actually several hours, instead of overnight. This desired performance expectation may be taken into account when calculating the windowing and parallelism parameters for the workload, e.g., by dividing the layout into enough windows of the correct configuration such that parallel processing of the windows will result in the intended performance timeframe. In an alternate embodiment, the expected processing timeframe is not provided by the user; instead, the EDA system calculates optimal windowing and parallelism parameters based upon system scheduling requirements, system parameters, heuristics, and/or other non-user supplied factors.

Historical data and past processing of similar/same IC designs may be taken into account and analyzed to configure the layout windows. In many cases, the IC design presently being processed includes only incremental changes over a prior version of the IC design. Therefore, run-time data from processing the earlier version of the IC design can be used to create configurations for the layout windows that will accurately match the desired performance expectations.

In some embodiments, the windows configured for a given layout may have different sizes. In alternate embodiments, some or all of the windows may be configured to have the same size.

At 304, interactions between different windows are addressed. Certain operations are local in nature to a portion of a layout, while other operations will necessarily involve data from other portions of a layout. This action will identify and address the situation if processing the layout windows will necessarily involve data from other layout windows.

Figure 4A:
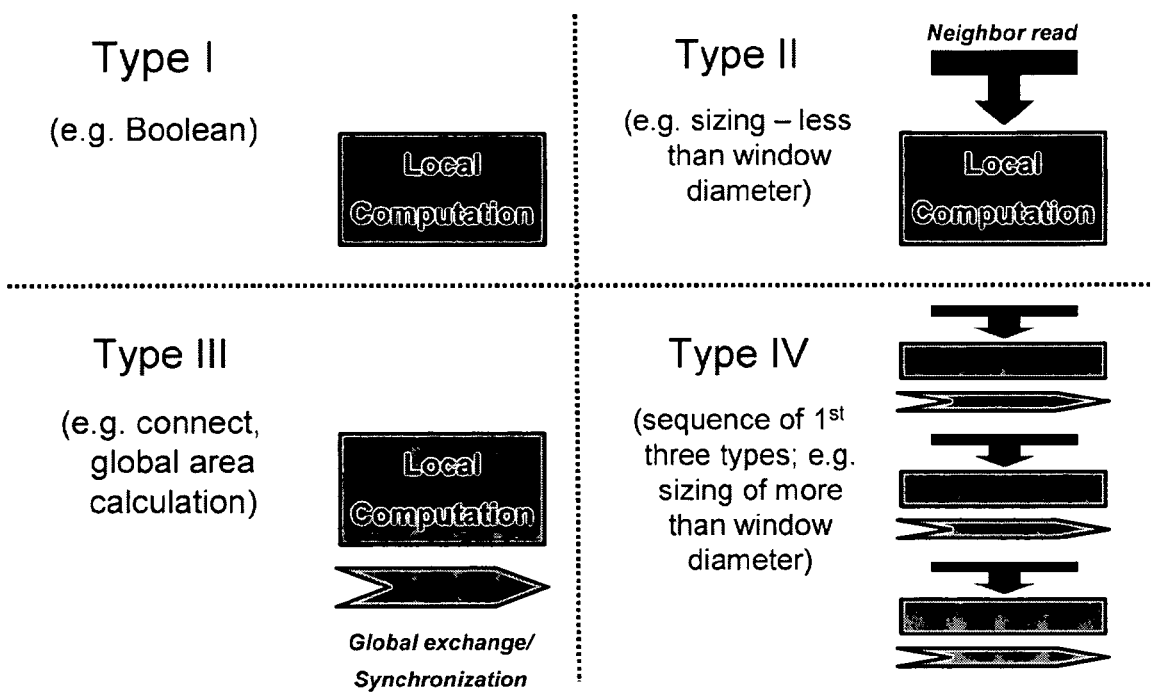
FIGS. 4A-D show categorization of operation types for an EDA tool.
Figure 4A:
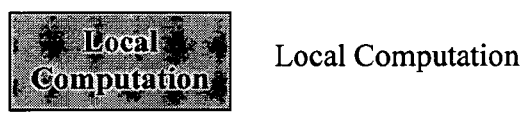
Figure 4A:
Figure 4A:

To perform this action, various classifications can be made for operations or rules that are intended to be performed upon a layout. FIG. 4A shows an example set of classifications for operations, such as rules to analyzed for a DRC operation.

Figure 4B:
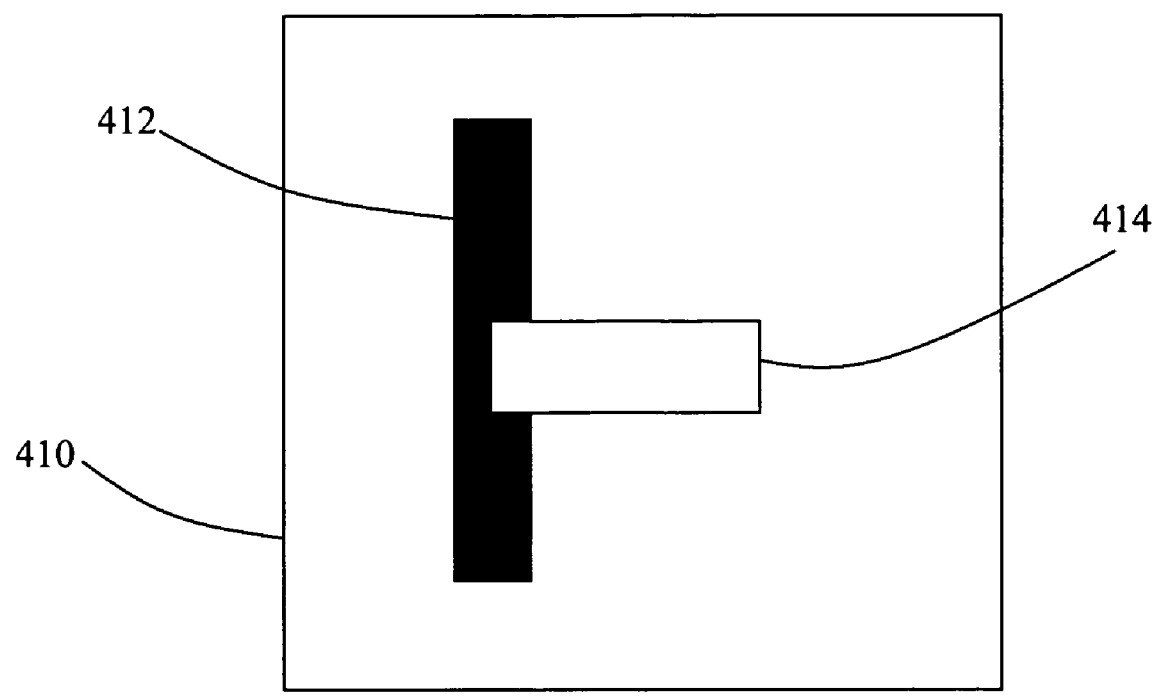

A first type of operation (Type I) is a local computation that can be performed without requiring any interaction with other windows. An example of this type of operation is a Boolean operation performed upon shapes in the layout window. To illustrate, consider layout window 410 in FIG. 4B, which includes polygons 412 and 414. If it is desired to performed to perform either a Boolean AND or OR operations between these two shapes 412 and 414, then these operations can be executed locally in window 410 without involving data from any other layout windows.

A second type of operation (Type II) involves situations where data from a neighboring windows must be accessed to perform the operation. This typically involves a limited interaction distance between one window and another.

Figure 4C:
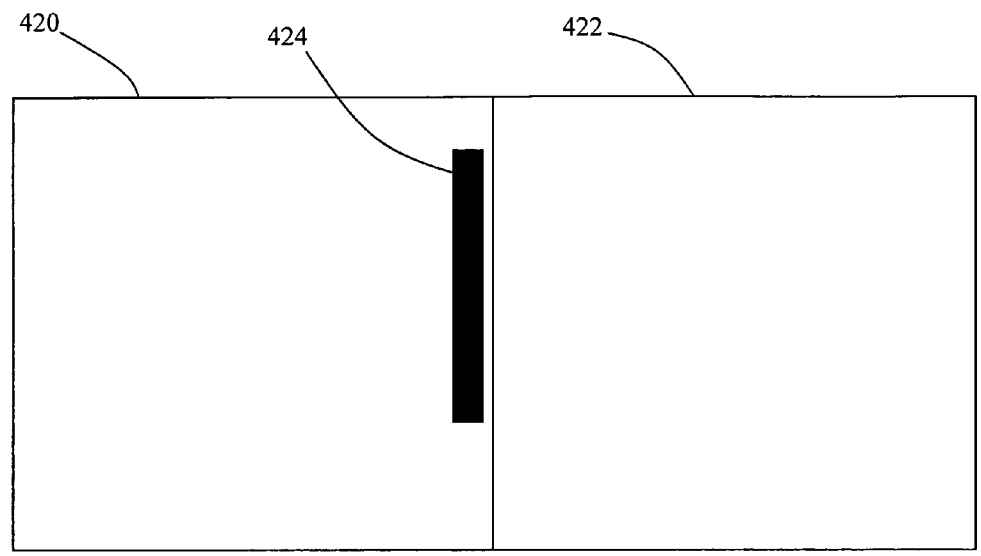
Figure 4C:
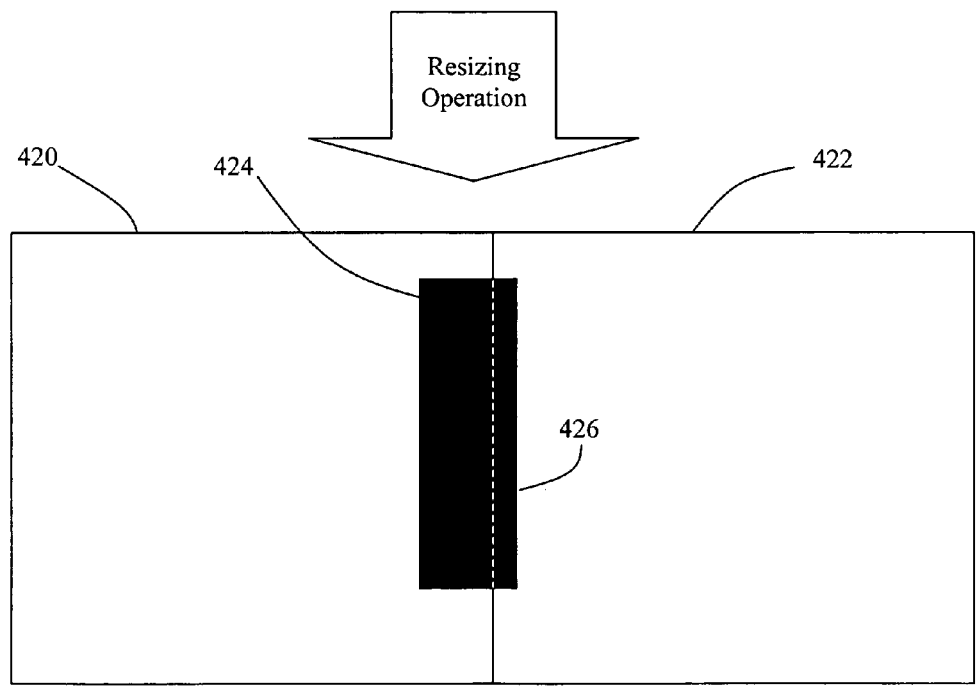

To illustrate, consider the layout windows 420 and 422 in FIG. 4C. A shape 424 is located in window 420. Assume that an operation is to be performed to resize shape 424 such that after the resizing operation, shape 424 includes a portion 426 that is located in neighboring window 422. The processing entity that operates upon window 422 will need to address this and know that portion 426 will appear in the window, even if portion 426 is a result of operating upon the shape 424 that originally appears only in another window 420.

Figure 4D:
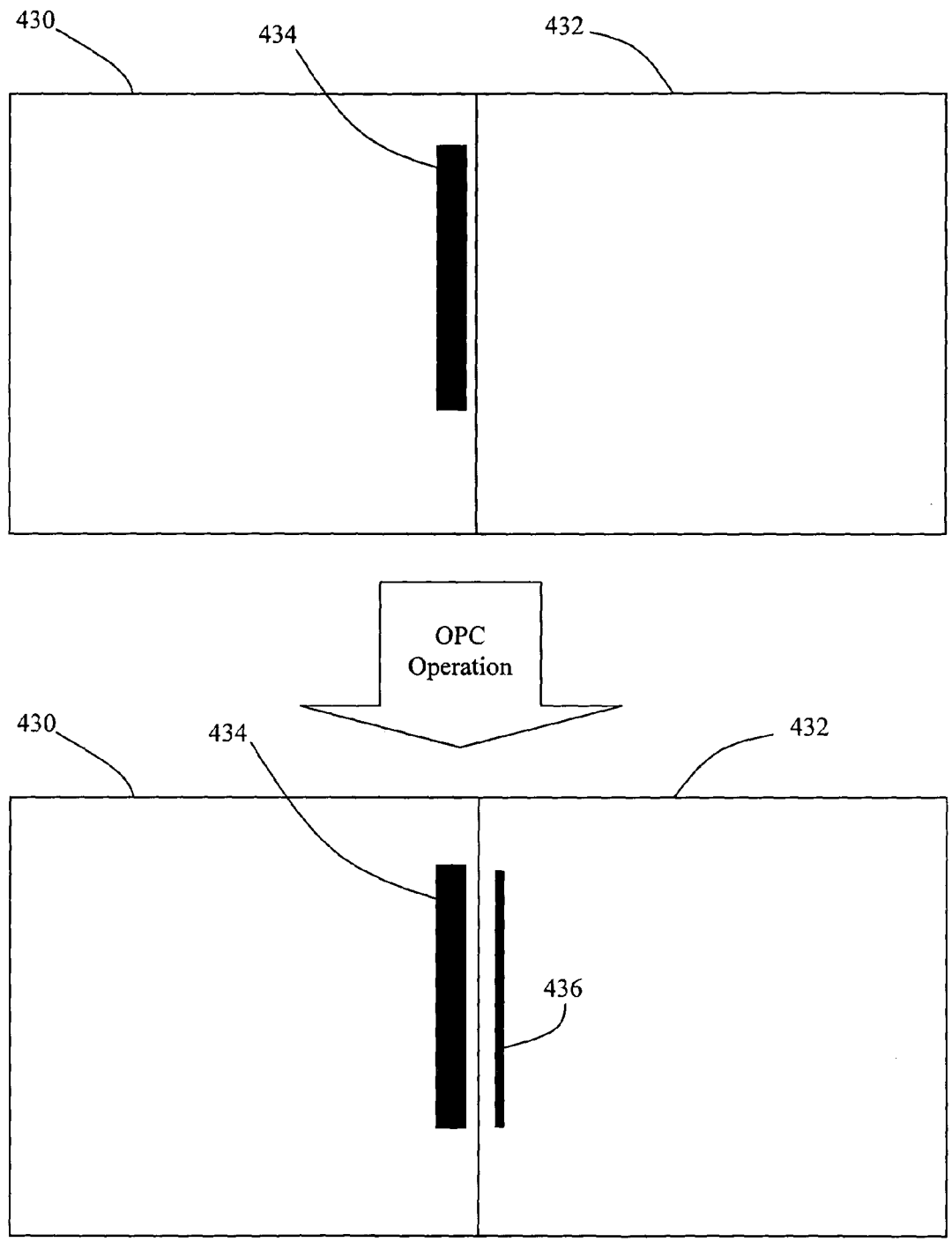

As another example, consider an optical proximity correction (OPC) operation that is to be performed upon a shape in a window. Adding a scattering bar to a layout is a common OPC operation performed by EDA tools. The illustrative example of FIG. 4D shows two windows 430 and 432 in which a shape 434 is located in window 430. Assume that it is desired to add a scattering bar 436 along the right-hand edge of shape 434. If the shape 434 is located sufficiently close to the border with neighboring window 432, then it is possible that scattering bar 436 will be located within window 432. The processing entity that operates upon window 432 will need to address this and know that scattering bar 436 will appear in the window, even if scattering bar 436 is a result of operating upon the shape 434 that originally appears only in another window 430.

A third type of operation (Type III) involves operations that relate to a global data exchange on output. For example, when calculating the total area of shapes on a given layer, one can calculate the total area of shapes on this layer in all windows, in parallel. Then, in a second step, the final global area is calculated by adding local areas in one global communication operation. Note that the global communication operations required for windowed PV are very similar to global data exchanges necessary when performing linear algebra algorithms on distributed memory machines.

The fourth type of operation (Type IV) is one that can be represented by a sequence of operations of Type I to III.

Figure 5:
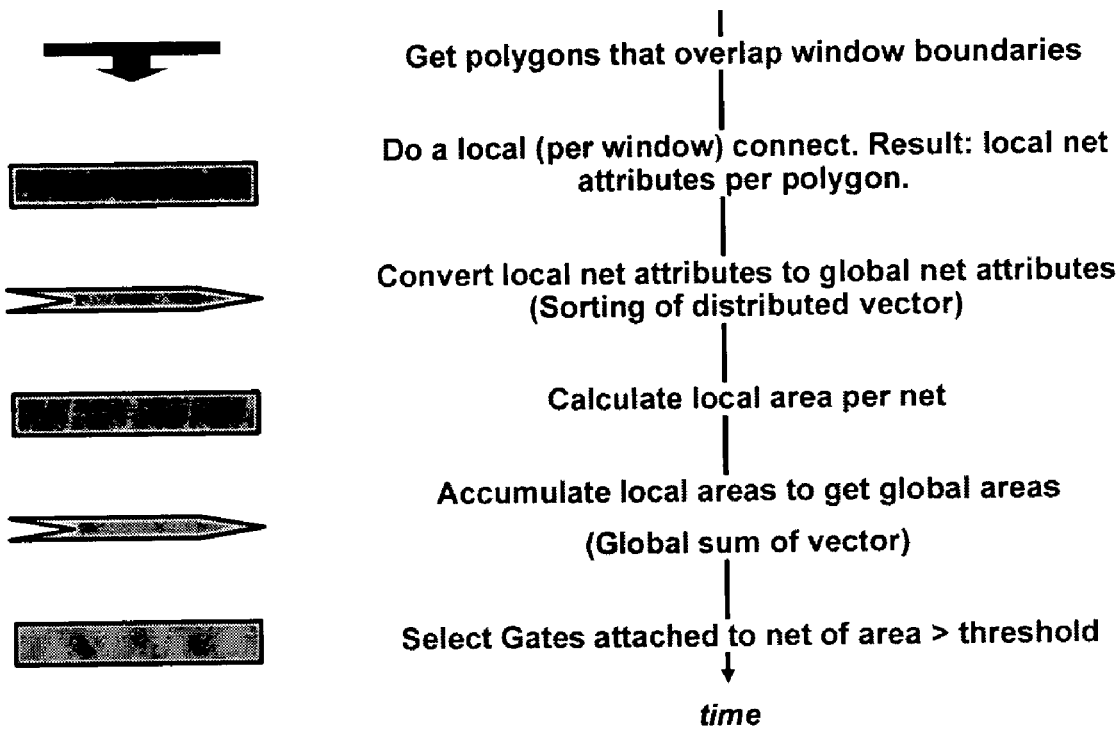
FIG. 5 shows the decomposition of a complex antenna check rule.

FIG. 5 shows an example of a DRC antenna check rule decomposed into the sequence of basic operations as described above. The complex rule has been decomposed into rules of Types I to III.

One way to address interactions between windows is to configure a "halo" around each window that interacts with a neighboring window. This means that operations performed for a given window will not just consider shapes within the boundaries of the window, but also any additional layout objects that exist within the expanded halo distance even if the layout objects appear outside of the window.

Figure 6:
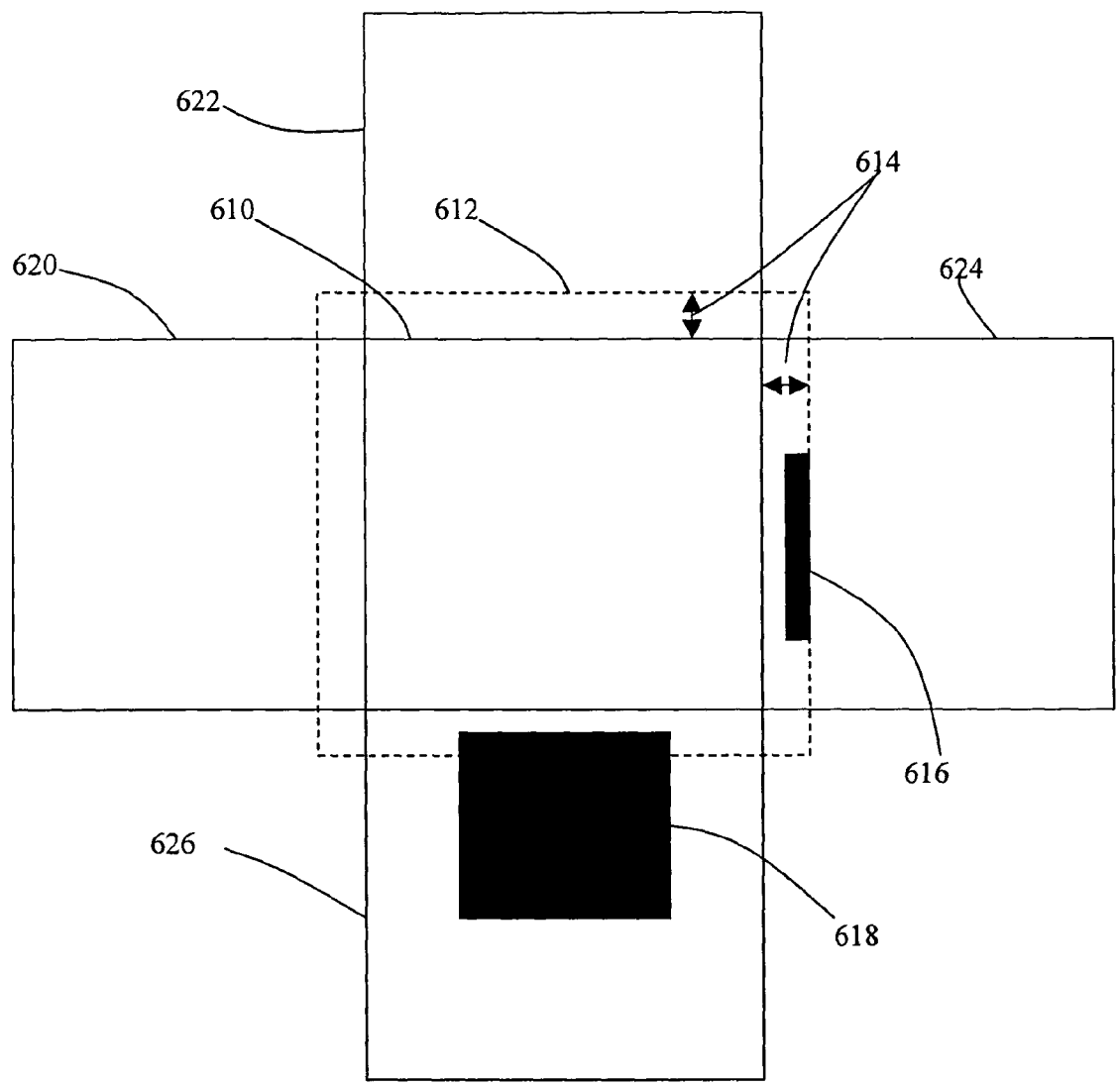
FIG. 6 illustrates a window configured with a halo.

FIG. 6 shows an illustrative example of a halo 612 that has been established around a window 610. Here, window 610 is surrounded by neighboring windows 620, 622, 624, and 626. A halo 612 has been configured with a halo spacing distance 614. Operations to be performed for window 610 will consider all objects falling within the expanded boundaries of the halo 612. Therefore, the portions of objects 616 and 618 that exist within the boundaries of halo 612 will be operated upon, even if those objects 616 and 618 doe not appear within window 610.

In some embodiments, the halo distance is established to address interaction distances for the specific operations or DRC rules that are to be performed for a given window. For example, consider an OPC operation involving placement of scattering bars. Assume that the maximum distance that needs to be considered to place a scattering bar is 20 nanometers from an edge of an object. If so, then the minimum interaction distance from one window to another to address scattering bars is at least 21 nanometers. The largest interaction distance for all operations to be performed for the window is identified, and that largest interaction distance becomes the minimum value of the halo spacing for the window. If the largest interaction distance for all operations for a given window is based upon placing scattering bars, then the halo spacing distance will be set at 21 nanometers for that window.

In some embodiments, each window may potentially be associated with a different halo spacing distance, based upon the type of operations to be performed for a given window. In alternate embodiments, a common halo spacing distance is shared by some or all of the windows.

Returning back to FIG. 3, once the windows have been suitably configured and interactions between windows have been addressed, some or all of the windows are processed in parallel to perform the EDA operations upon the layout (306). As noted above, each processing entity may receive one or more of the layout windows for processing. In one embodiment, a "lazy scheduling" approach is taken to assigning operations to processing entities. In this approach, the most computational difficult jobs are assigned to the most powerful processing entities. As described in more detail below, sampling can be performed to help identify the most computationally difficult operations.

The layout windows can be executed in parallel using, for example, either the distributed-memory parallel approach or the shared-memory parallel approach. The distributed-memory parallel approach involves software that can make efficient use of multiple processing devices, such as CPUs, where each CPU may access its own memory. With respect to implementation, message passing primitives (such as UNIX sockets, MPI, PVM, etc.) are typically employed when coordinating execution of program components running on different CPUs. The shared-memory parallel approach involves software that makes use of multiple processing devices, e.g., CPUs, that can address common physical memory. With respect to implementation, shared memory can be allocated, read and written from all program components being executed on different CPUs. Coordination is accomplished via atomic memory accesses, also called semaphores.

In some embodiments, the parallel processing is performed using distributed-memory parallelization. However, if the product's memory consumption is efficient; a distributed-memory parallel program can be ported to a shared-memory machine by emulating a distributed computer network on a shared-memory computer. Due to increased spatial locality, in some cases, a distributed parallel program ported back to a shared memory parallel machine runs faster than a similar program developed from the beginning using the shared-memory parallel programming paradigm.

Figure 7:
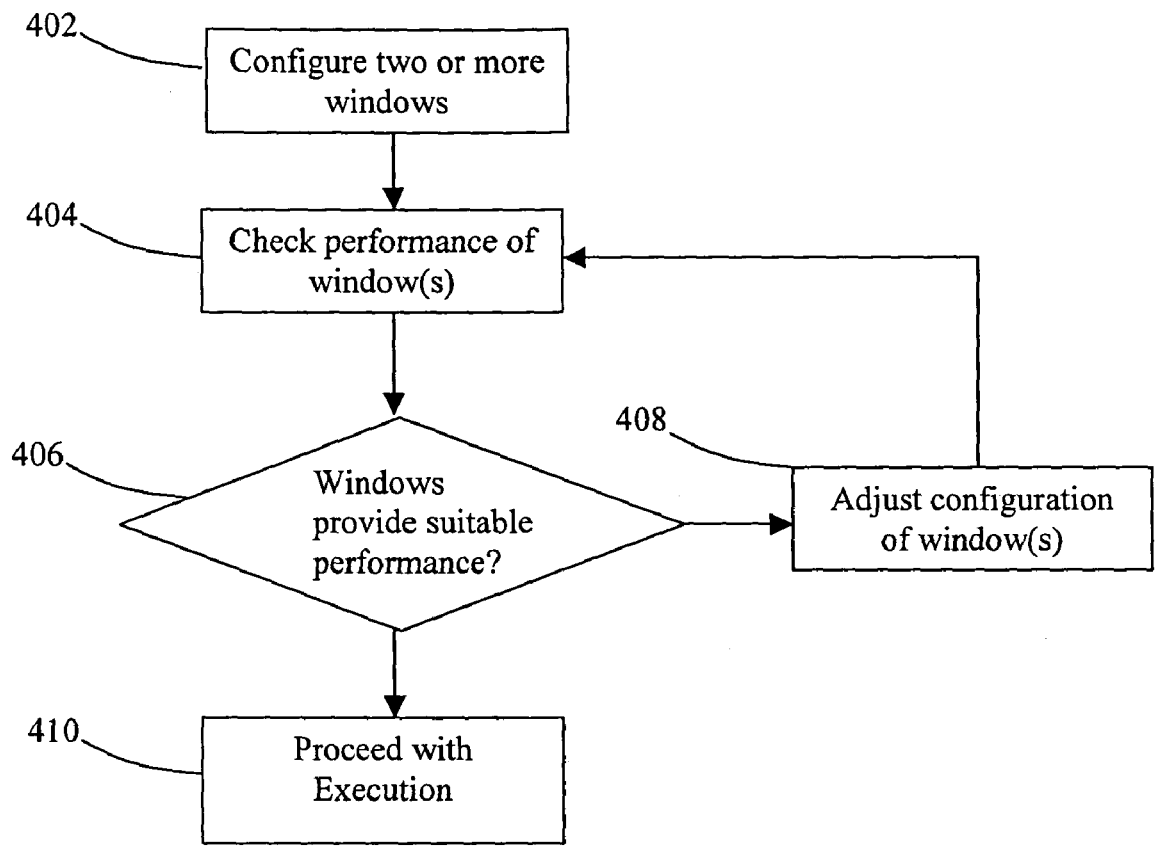
FIG. 7 shows a flow diagram of a process for implementing windows for an EDA tool.

FIG. 7 shows a flowchart of an approach for implementing windows according to an embodiment of the invention. At 402, the IC design is divided into a plurality of windows. The size of the windows are selected to meet or optimize the expected performance expectation of the parallelized processing. The amount of time required to perform EDA processing for a particular window may be dependent upon the size of the window. All else being equal, it is likely that the larger windows will require greater amounts of time for processing as compared to smaller windows. It is noted that the greater the size of the window, there likely will also be increased amounts of overhead for the parallel processing, e.g., in terms of communications and integration of data results. One rule of thumb that may be applied to certain systems is that the computation overhead is proportional to the area of the window while communications overhead is proportional to the perimeter of the window.

In addition, the type and/or quantity of certain structures within the window may affect the performance of processing for that window. The identification of certain types or quantities of structures within a window that will affect performance is very dependent upon the specific EDA tool operation that is being performed. For example, certain types of processing, such as certain kinds of DRC rules checking, are dependent upon the density of structures within a given layout area. Therefore, all else being equal, windows having greater instance densities will be slower to process for these types of DRC verification than for other windows having smaller instance densities. Other examples include certain DRC rules that relate specifically to pattern density. Therefore, for these pattern density-related rules, windows having greater pattern densities will be slower to process for these types of DRC verification than for other windows having smaller pattern densities.

The next action is to check or predict the expected performance of the processing system based upon the set of layout windows that have been identified (404). As described below, "sampling" can be used to provide performed estimation. If the expected performance meets the desired performance level (406), then the processing system continues with parallel execution of the identified layout windows (410).

If the expected performance does not meet desired performance levels, then one or more of the layout windows are reconfigured (408) and the process returns back to 404. Examples of parameters for the layout windows that may be reconfigured include location, size, shape, and/or number of windows.

Sampling

Figure 8:
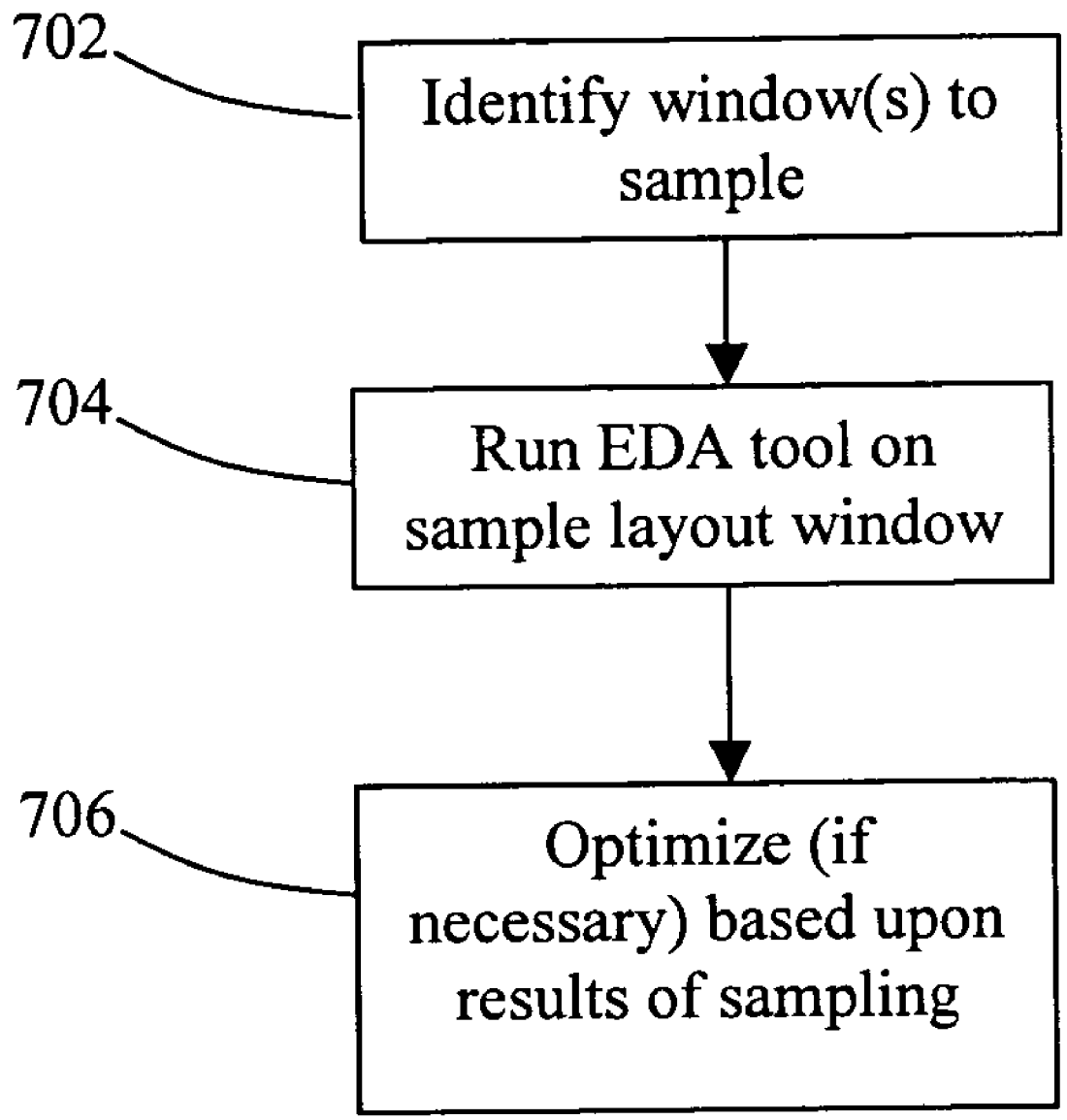
FIG. 8 shows a flow diagram of a process sampling window(s).

Layout "sampling" can be used to provide dynamic performance prediction of the parallelized processing system. FIG. 8 shows a flowchart of a process for layout sampling according to an embodiment of the invention. At 702, the IC design is sampled by selecting one or more layout windows. The sampled window(s) are then used to generate run-time data for performance prediction of the full processing run. In the present embodiment, the run-time data is obtained by actually running the EDA tool upon the data in the window being sampled. Execution traces and/or performance results are recorded during processing of the window. The run-time results can be used to extrapolate the performance of the EDA tool when the entire workload is processed.

The collected run-time data can also be used to optimize the process of forming windows and executing the workload (706). For example, the run-time data can be used to adjust the final size of the layout windows. If the actual computational performance of the EDA tool against the window is too slow to achieve the desired performance timeframe, then the size of the window can be adjusted to be smaller. If the actual computational performance of the EDA tool against the window is faster than expected, then the size of the window can be adjusted to be larger or placed in a different location.

Sampling the layout and generating a trace for it takes time and introduces overhead in the overall verification run that should be taken into account when determining the configuration to be used for the parallel processing. The amount of overhead devoted to determining the windows parameters and checking sampled performance should be small enough such that when it is added to the actual processing of the workload, the overhead processing time fits within desired performance expectations.

Figure 9:
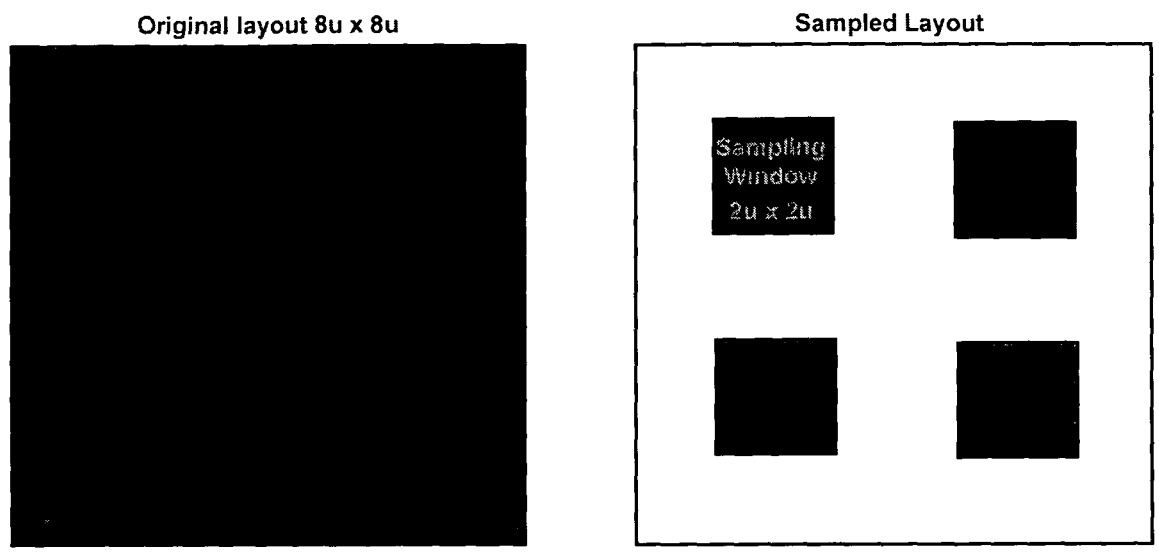
FIG. 9 illustrates selection of sampling windows.

A layout sampling example is shown in FIG. 9. In this example, an IC design of size 8 um×8 um is sampled by selecting 4 windows of size 2 um×2 um each. In this example, the samples are distributed uniformly across the layout. The total area covered by the samples is 25% of the original chip area in this example. This ratio is referred to herein as the sampling factor.

Figure 10:
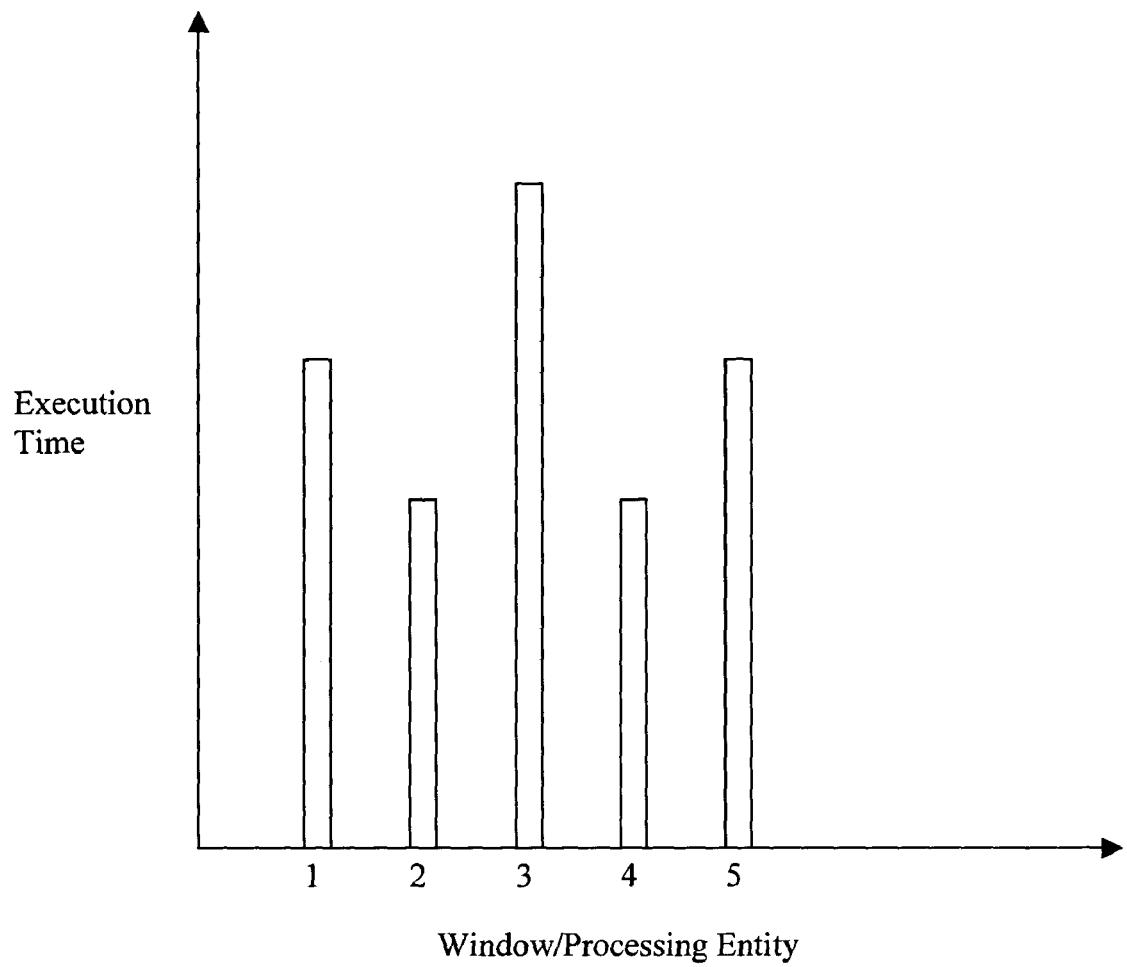
FIG. 10 shows an example chart of execution times for different windows/processing entities.

Layout sampling can also be performed as a factor of identifying one or more parameters which are predicted to affect the run-time performance of a given window. To explain this, consider that the overall execution time of the parallelized system is related to the slowest workload and/or processing entity that is handling work in the system. FIG. 10 is an example chart showing the hypothetical processing of a EDA tool workload over multiple windows/processing entities. It can be seen that window/processing entity 3 has the slowest execution time of any of the windows/processing entities being charted. In this example, the fastest the system can process the work is only as fast as the execution time for window/processing entity 3, which is the slowest window/processing entity in the chart.

Therefore, one way to configure the windows in some embodiment to ensure that system can process the workload within the expected performance requirements is to make sure that the window that is expected to be the slowest to process will meet the expected performance requirements.

Consider a PV tool for which processing time is highly dependent upon instance density. For this type of PV tool, it is preferable that the window having the greatest instance density is selected as the sample window. For purposes of this example, instance density would refer to the density of instances throughout the different levels of the IC design that exist within the geometric boundaries of the selected window.

Figure 11:
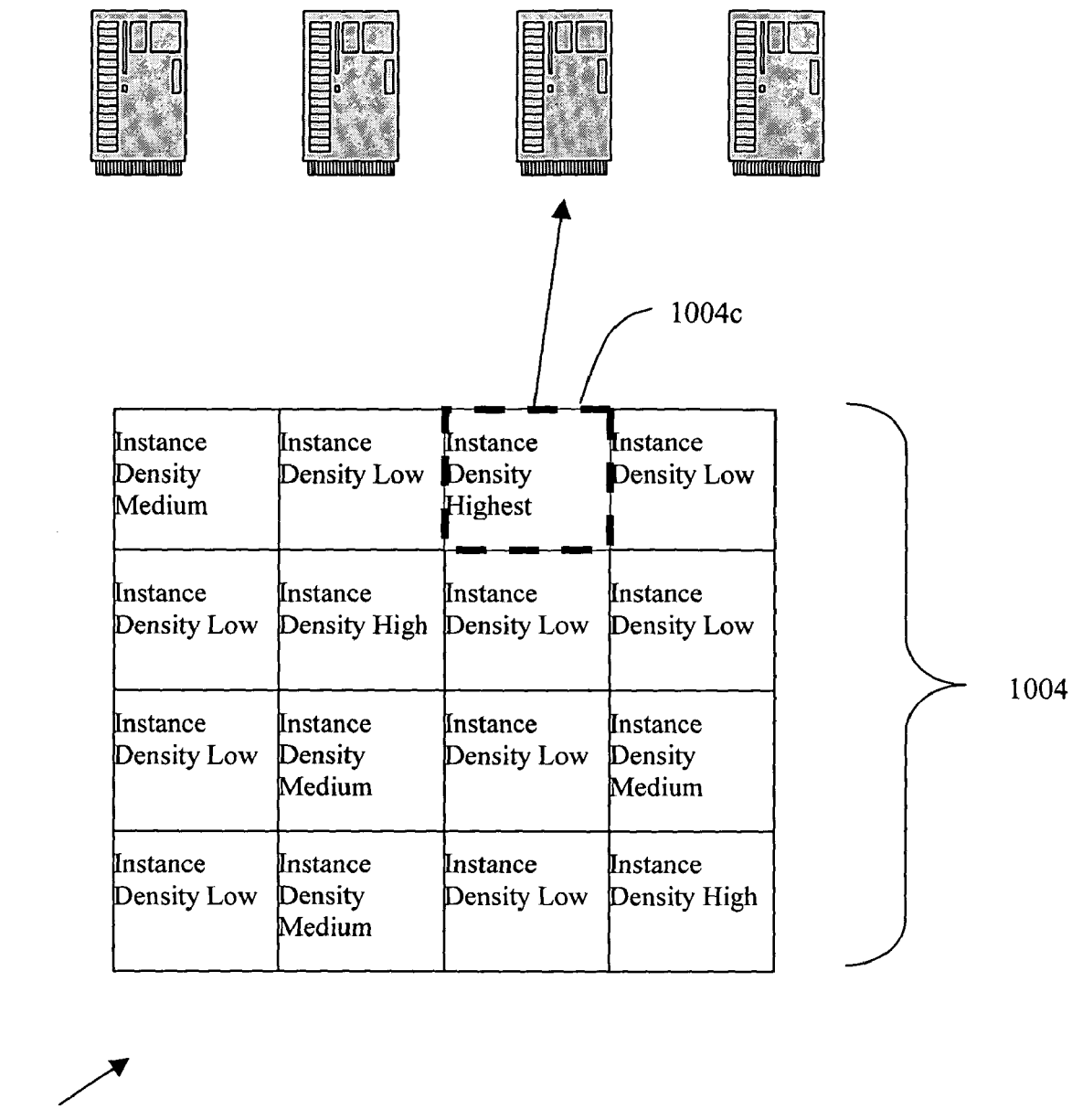
FIG. 11 illustrates selection of a window sample based upon instance density.

FIG. 11 illustrates this circumstance of selecting a sample window based upon instance density. In this example, the IC layout 1002 corresponds to a plurality of windows 1004. Some of the layout windows posses a higher instance density than other layout windows. In this example, layout window 1004*c* has the highest instance density in the collection of windows 1004 in IC layout 1002. Therefore, layout window 1004*c* is selected as the sample window to execute the performance estimate.

Figure 12:
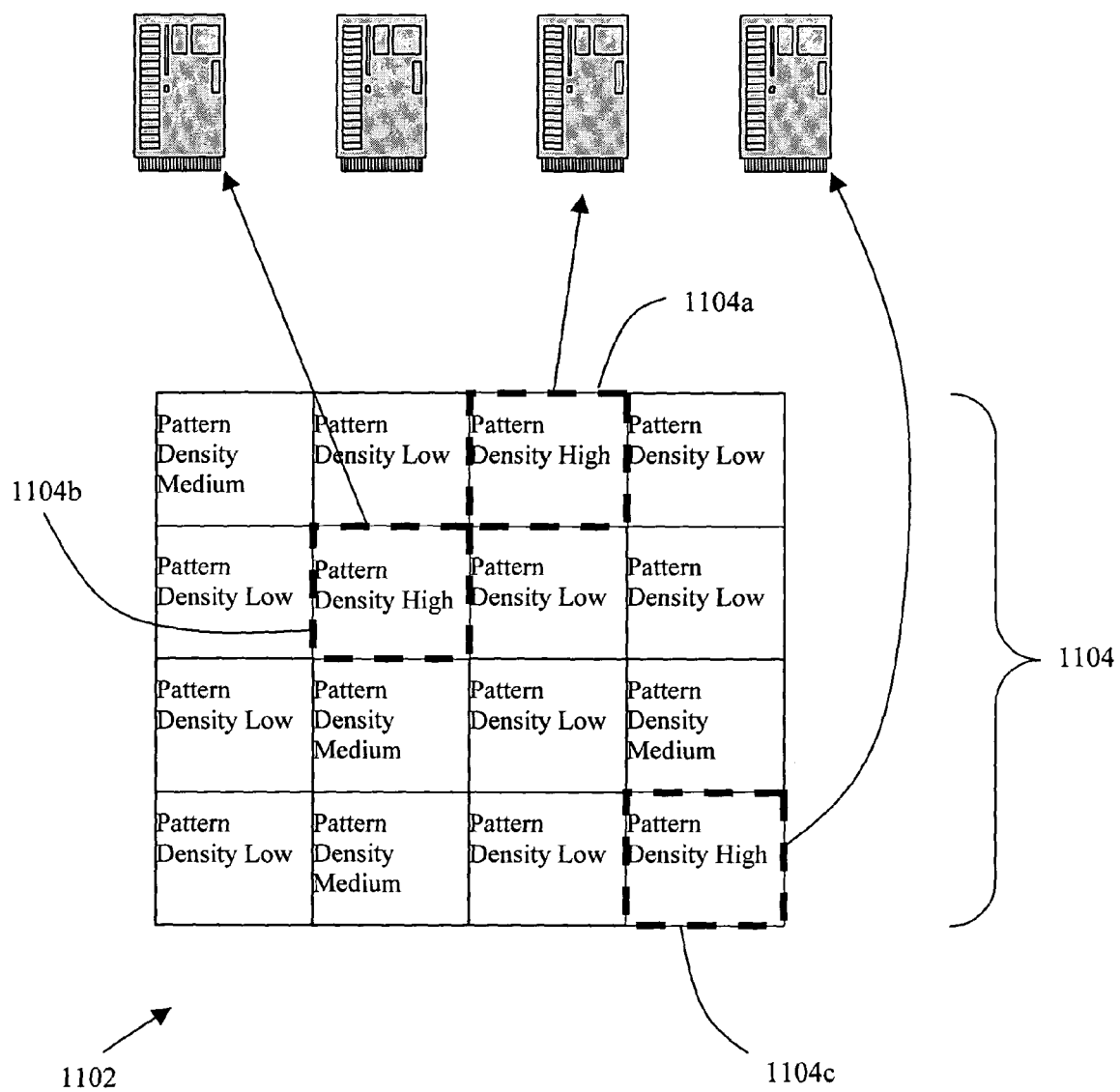
FIG. 12 illustrates the selection of multiple window samples based upon pattern density.

Multiple windows can be sampled according to some embodiments of the invention. Given a particular sampling factor, multiple smaller windows can be chosen rather than a single larger window. FIG. 12 illustrates an example layout 1102 that corresponds to a set of windows 1104. Instead of selecting just a single window to be sampled, multiple windows 1104*a*, 1104*b*, and 1104*c* are selected for sampling. In this example, assume that the processing time of the relevant EDA tool is dependent upon pattern density. Therefore, to selected the window having the slowest expected processing time, the sampled windows are selected based upon their pattern density. Here, the sampled windows 1104*a*, 1104*b*, and 1104*c* all correspond to higher pattern densities as compared to other windows 1104 on the IC layout 1102.

Figure 13:
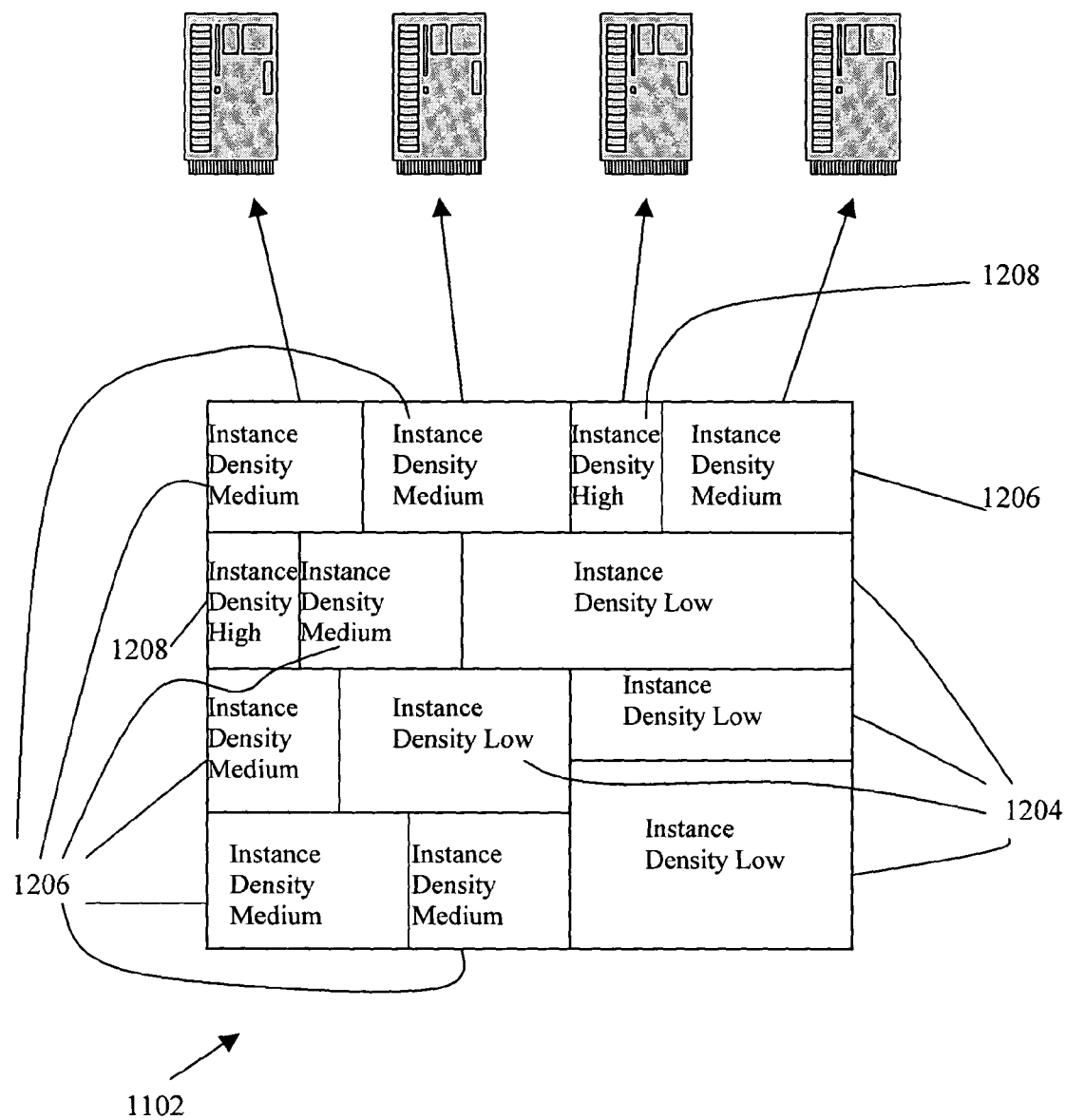
FIG. 13 shows an IC layout divided into a plurality of different sized windows.

This type of information relating to factors that affect processing time can be used to configure the size, shape, and location of layout windows. For example, consider again a PV tool for which processing time is highly dependent upon instance density. The different layout windows for the IC design can be configured to have different sizes and/or shapes based upon instance densities in the IC design. This is illustrated in the example of FIG. 13. Assume that layout 1202 is to be processed by a PV tool for which processing time is highly dependent upon instance density. Here, the different windows can be configured to try and balance the processing time for the different windows. Therefore, windows 1204 corresponding to a low instance density will be configured to be larger than windows 1206 corresponding to a medium instance density, which are larger than windows 1208 corresponding to a high instance density.

A determination can be made whether sampling accuracy is high enough. The following algorithm to calculate a correlation function that can be used to decided whether the sampling is sufficiently accurate:

Percentage Correlation(Trace T1, Trace T2, Percentage x)
{
// T1, T2 are vectors of execution times, the n'th element
// contains the execution time of the n'th operation
// in the trace.
  1. total_T1:=total run time of T1
  2. Sort T2 in descending order of execution times.
  3. Select the top x % operations in T2. For example, if T2 has 100 operations, select the top, slowest x operations. Call this selection of operations S, itself a vector of execution times.
  4. ExecutionTime tmp:=0
  5. For each op in S calculate: tmp:=tmp+S[op]
  6. Return tmp/total_T1 }

This function can be used to compute correlations between a full and a sampled trace, between two sampled traces, and for the computation of the auto-correlation of a trace. For a given trace T and number x of most expensive operations, the auto-correlation Correlation(T,T,x) computes the performance improvement that can be gained when these x operations are eliminated. Since the correlation function is a monotonically increasing function, its integral (from x=0 to 100%) can also be used to automatically predict performance accuracy.

Windowing and Other Types of Parallelism

Windows-based parallelism can also be used in conjunction with other types of parallelism in the EDA processing system. For example, in the context of a PV tool, a PV tool can make use of parallelism at different levels of the tool's execution. A rule deck operates on multiple layers, and can often be processed independently. Therefore, some rules can be executed in parallel. This is referred to as rule-based parallelism.

Based on its topology, a design database exhibits multiple forms of parallelism that can be used for domain decomposition and PV parallelization: A 2D layout can be decomposed into 2D segments. If interaction distances are small, such decomposition allows for efficient parallelization of DRC operations. As noted above, windows are created by cutting the layout into 2D windows. In addition, parallelism can be implemented by processing different cells of the design hierarchy in parallel. This is referred to herein as cell-based parallelism.

Window-based parallelism can be implemented as a simultaneous extension and constraint to cell-based parallelism. Windows can be represented by new cells introduced at the top-level of the design hierarchy. Parallelization is then only limited to this hierarchy level.

The design database also includes data-structures representing connectivity and passive devices. These data-structures are used during NVN or parasitic extraction (RCx). Since the overall chip circuitry can be decomposed into sub-circuits and nets, this is an additional source of parallelism, the so-called net-based parallelism. Windows can also be constructed on top of, or in conjunction with net-based parallelism.

Devices are represented by multiple shapes. Several devices form a gate that typically forms a leaf node in the design hierarchy. Statistically, in a design database, a minority of transistor and gate types (for example, inverters and NAND gates) are dominant. Therefore, patterns that are replicated many times can be identified, in particular on lower layers. A pattern is an assembly of one or more polygons. If a statistically dominant transistor can be represented by such a pattern on a given layer, the same pattern can be found many times (linearly transformed) at many places in the layer. This repetition can be used to extract parallelism for rules with an interaction distance smaller than pattern dimensions. Windows can also be constructed on top of, or in conjunction with pattern-based parallelism.

Recognition of geometric layout patterns can be used to improve performance of most geometric PV and also RET operations. There are also other applications, such as layout compaction, cell projection for direct ebeam writing tools, etc. Ideally, in the long term, we desire a design environment that generates a limited "vocabulary" of patterns such that their detection will become obsolete during verification and RET (patterns and their names can be identified via a new hierarchy representation).

The windowing approach of the present invention can also be used to perform OPC operations. Portions of a layout can be configured into layout windows, and separate processing entities used to handle OPC processing for some or all of the windows in parallel.

Yield analysis is another type of analysis that can be performed in conjunction with windowing. In particular, the layout is partitioned into windows as described above. Each window is then analyzed to determine yield projections based upon the configuration of shapes within that window. The overall yield determination or the IC design can be determined based upon aggregating analysis results for all of the windows.

System Architecture Overview

Figure 14:
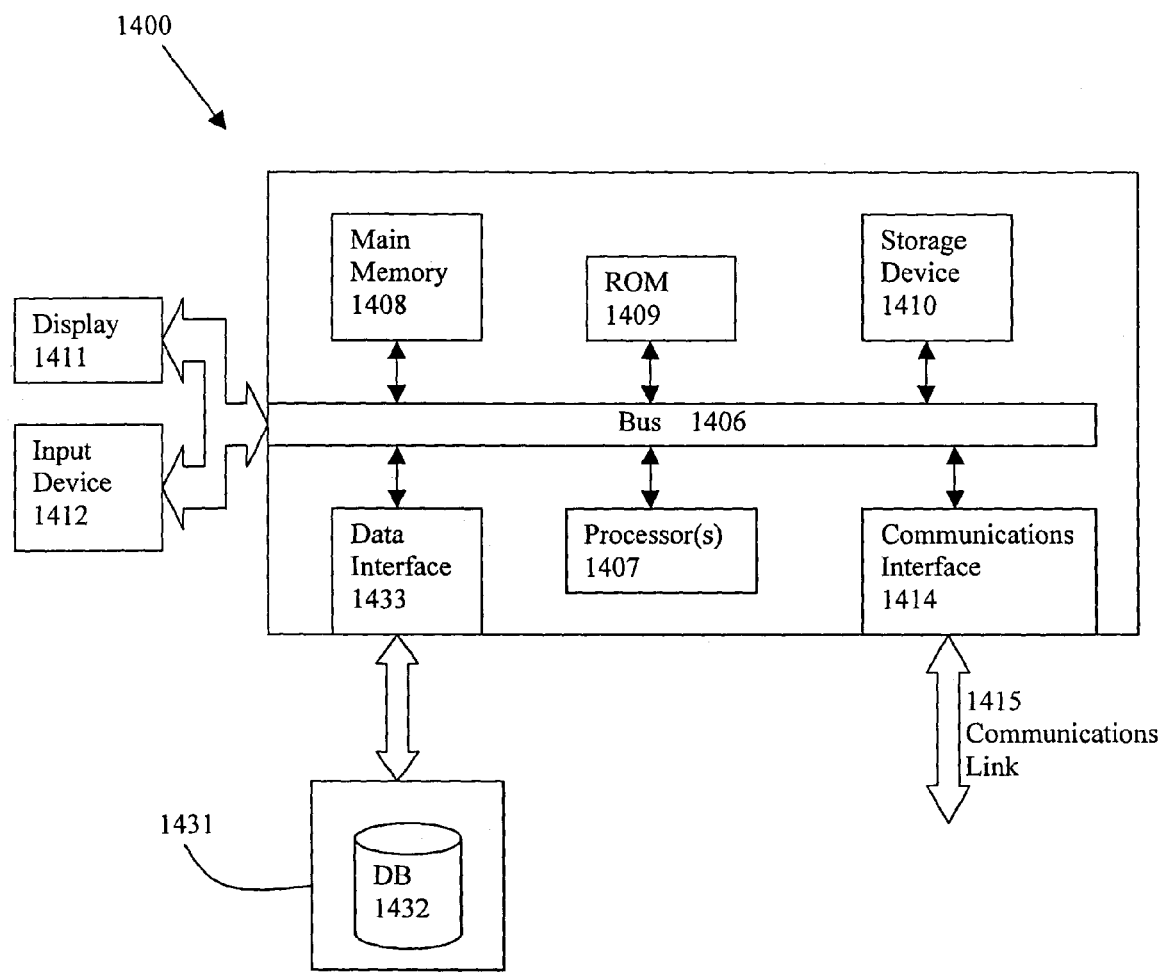
FIG. 14 illustrates an example computing architecture with which the invention may be implemented.

FIG. 14 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408. Transmission media includes coaxial cables, copper wire, and fiber optics, including wires that comprise bus 1406. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for processing of an electronic design automation tool, comprising:
   identifying operations or rules to be performed by the electronic design automation tool on an electronic design;
   analyzing the electronic design and the operations or rules to determine at least a portion of the electronic design that is to be divided into a plurality of two-dimensional layout windows;
   dividing at least the portion into the plurality of two-dimensional layout windows;
   determining a sample window for dynamic performance prediction, wherein the sample window instead of another sample window is selected for the dynamic performance prediction based at least in part upon a desired performance requirement;
   providing the dynamic performance prediction for predicting the performance of a full processing run of the electronic design by processing the sample window, wherein the dynamic performance prediction is provided prior to completion of the full processing run of the electronic design;
   extrapolating, by using a processor, the performance of the electronic design automation tool for the full processing run based at least in part upon the dynamic performance prediction, wherein the processed sample window provides information for determining a configuration of the plurality of two-dimensional layout windows to be used for parallel processing by the electronic design automation tool on the electronic design; and
   storing the performance in a volatile or non-volatile computer readable storage medium for use in the electronic design or in manufacturing of an electronic circuit corresponding to the electronic design or displaying the performance on a display device.

2. The method of claim 1 in which the operations or rules to be performed on the electronic design comprises physical verification operations.

3. The method of claim 1 in which the plurality of two-dimensional layout windows corresponds to output partitioning of the electronic design, wherein each of the plurality of two-dimensional layout windows is eligible to be individually operated upon by different processing entities.

4. The method of claim 1 in which the plurality of two-dimensional layout windows are configured to be either rectangular or non-rectangular.

5. The method of claim 1 in which some or all of the plurality of two-dimensional layout windows are configured to have the same or different sizes.

6. The method of claim 1 in which the plurality of two-dimensional layout windows are configured such that a cell master is outside a window, but the window includes instances of this cell master, a new cell master inside the window is generated that completes the hierarchy of the window's layout.

7. The method of claim 1 in which, when cells and instances intersect a two-dimensional layout window boundary, shapes of some or all of the intersecting cell/instance are flattened, partially flattened, or a new cell is created and stored in the design hierarchy instead of the original cell/instance.

8. The method of claim 1 in which multiple two-dimensional layout windows are mapped to the same processing entity.

9. The method of claim 1 in which size, composition, or location of a two-dimensional layout window is selected to meet desired performance expectations.

10. The method of claim 9 in which historical data of similar or same electronic designs may be taken into account and analyzed to configure the two-dimensional layout windows.

11. The method of claim 1 in which interactions between two or more of the plurality of two-dimensional layout windows are addressed based upon whether the operations or rules are local in nature to a portion of a layout or will involve data from other portions of a layout.

12. The method of claim 11 in which for operations or rules that involve data from other two-dimensional layout windows, classifications are made for operations or rules that include at least one or more of the following classifications:
   (Type I) a local computation that can be performed without requiring any interaction with other windows;
   (Type II) data from a neighboring windows must be accessed to perform the operation;
   (Type III) a global data exchange on output; and
   (Type IV) a sequence of operations of Type I to III.

13. The method of claim 1 in which a halo is configured for the first layout window that will consider not just shapes within the boundaries of the first layout window, but also any additional layout objects that exist within the halo even if the layout objects appear outside of the first layout window.

14. The method of claim 13 in which a halo distance is established to address one or more interaction distances for specific operations or rules that are to be performed for a given two-dimensional layout window.

15. The method of claim 14, further comprising:
   defining a minimum halo distance for the halo distance.

16. The method of claim 15, in which the minimum halo distance for the halo distance is defined to be a maximum interaction distance for the specific operations or rules to be performed.

17. The method of claim 13 in which two or more of the two-dimensional layout windows correspond to different halo distances.

18. The method of claim 13 in which a common halo distance is shared by two or more layout windows.

19. The method of claim 1 further comprising:
   checking expected performance of the configuration of the plurality of two-dimensional layout windows;
   determining if suitable performance is provided by the configuration of the plurality of two-dimensional layout windows; and
   adjusting the configuration of the plurality of two-dimensional layout windows if the expected performance is not adequate.

20. The method of claim 19 in which layout sampling is performed to determine the expected performance is adequate.

21. The method of claim 20 in which the layout sampling is performed by a process, comprising:
   identifying one or more windows to sample;
   executing the EDA tool against the one or more windows to sample; and
   reviewing performance results from the act of executing the EDA tool against the one or more windows to sample.

22. The method of claim 20, in which the expected performance is based in part upon instance density of each of the plurality of two-dimensional layout windows.

23. The method of claim 1, in which the one of the plurality of two-dimensional layout windows includes a first physical component and another of the plurality of two-dimensional layout windows includes a second physical component, where the first and the second physical components have a same logical hierarchy.

24. A computer implemented method for parallel processing of an electronic design automation tool, comprising:
    identifying a plurality of two-dimensional layout windows in an integrated circuit (IC) design by dividing a portion of the IC design into the plurality of the two dimensional layout windows based at least in part upon analyzing the IC design and operation or rule to be performed by the electronic design automation tool on the IC design;
    determining whether a first layout window interacts with a second layout window of the plurality of two-dimensional layout windows, in which a halo is configured around the first layout window to include a design component of the second layout window if the first layout window is determined to interact with the second layout window;
    processing, by using a processor, design components of a sample window with the operation or rule, wherein the sample window instead of another layout window is selected for dynamic performance prediction from one of the plurality of two-dimensional layout windows based at least in part upon a desired performance criterion requirement;
    providing the dynamic performance prediction for predicting the performance of processing the sample window, wherein the dynamic performance prediction is provided prior to completion of a full processing run of the IC design;
    extrapolating the performance of the electronic automation tool for the full processing run based at least in part upon the dynamic performance prediction, wherein the processed sample window provides information for determining a configuration of the plurality of two-dimensional layout windows to be used for parallel processing by the electronic design automation tool on the IC design; and
    if the first layout window is determined to interact with the second layout window, processing the operation or rule on the first layout window, considering the design component within the halo;
    storing the performance in a volatile or non-volatile computer readable storage medium for use in the electronic design or in manufacturing of an electronic circuit corresponding to the electronic design or displaying the performance on a display device.

25. The method of claim 24 in which a halo is configured for a two-dimensional layout window that will consider not just shapes within the boundaries of the two-dimensional layout window, but also any additional layout objects that exist within the halo distance even if the layout objects appear outside of the two-dimensional layout window.

26. The method of claim 24 further comprising:
    checking expected performance of the configuration of the plurality of two-dimensional layout windows;
    determining if suitable performance is provided by the configuration of the plurality of two-dimensional layout windows; and
    adjusting the configuration of the plurality of two-dimensional layout windows if the expected performance is not adequate.

27. The method of claim 24 in which layout sampling is performed to determine the expected performance is adequate.

28. The method of claim 1 or 24, in which the plurality of two-dimensional layout windows are constructed in conjunction with rule-based parallelism.

29. The method of claim 1 or 24, in which the plurality of two-dimensional layout windows are constructed in conjunction with cell-based parallelism.

30. The method of claim 1 or 24, in which the plurality of two-dimensional layout windows are constructed on top of or in conjunction with net-based parallelism.

31. The method of claim 1 or 24, in which the plurality of two-dimensional layout windows are constructed in conjunction with pattern-based parallelism.

32. A system for parallel processing of an electronic design automation tool, comprising:
    a processor for:
    identifying a plurality of two-dimensional layout windows in an integrated circuit (IC) design by dividing a portion of the IC design into the plurality of the two dimensional layout windows based at least in part upon analyzing the IC design and operation or rule to be performed by the electronic design automation tool on the IC design;
    determining whether a first layout window interacts with a second layout window of the plurality of two-dimensional layout windows, in which a halo is configured around the first layout window to include a design component of the second layout window if the first layout window is determined to interact with the second layout window;
    processing design components of a sample window with the operation or rule, wherein the sample window instead of another layout window is selected for dynamic performance prediction from one of the plurality of two-dimensional layout windows based at least in part upon a desired performance requirement;
    providing dynamic performance prediction for predicting the performance of processing the sample window, wherein the dynamic performance prediction is provided prior to completion of a full processing run of the IC design;
    extrapolating the performance of the electronic automation tool for the full processing run based at least in part upon the dynamic performance prediction, wherein the processed sample window provides information for determining a configuration of the plurality of two-dimensional layout windows to be used for parallel processing by the electronic design automation tool on the IC design; and
    if the first layout window is determined to interact with the second layout window, processing the operation or rule on the first layout window, considering the design component within the halo; and
    a volatile or non-volatile computer readable storage medium for storing the prediction for use in the electronic design or in manufacturing of an electronic circuit corresponding to the electronic design or a display device for displaying the prediction.

33. The method of claim 32, in which the halo is configured for the first layout window that will consider not just shapes within the boundaries of the first layout window, but also any additional layout objects that exist within the halo even if the layout objects appear outside of the first layout window.

34. The method of claim 33, in which a halo distance is established to address one or more interaction distances for specific operations or rules that are to be performed for a given two-dimensional layout window.

35. The method of claim 33, in which two or more of the two-dimensional layout windows correspond to different halo distances.

36. The method of claim 33, in which a common halo distance is shared by two or more layout windows.

37. The system of claim 32, in which the halo is configured for the first layout window that will consider not just shapes within the boundaries of the first layout window, but also any additional layout objects that exist within the halo even if the layout objects appear outside of the first layout window.

38. The system of claim 37, in which a halo distance is established to address one or more interaction distances for specific operations or rules that are to be performed for a given two-dimensional layout window.

39. The system of claim 37, in which two or more of the two-dimensional layout windows correspond to different halo distances.

40. The system of claim 37, in which a common halo distance is shared by two or more layout windows.

41. A computer program product comprising a volatile or non-volatile computer usable medium having executable code to execute a process by one or more processors for parallel processing of an electronic design automation tool, the process comprising:
   identifying a plurality of two-dimensional layout windows in an integrated circuit (IC) design by dividing a portion of the IC design into the plurality of the two dimensional layout windows based at least in part upon analyzing the IC design and operation or rule to be performed by the electronic design automation tool on the IC design;
   processing design components of a sample window with the operation or rule, wherein the sample window instead of another layout window is selected for dynamic performance prediction from one of the plurality of two-dimensional layout windows based at least in part upon a desired performance requirement;
   providing dynamic performance prediction for predicting the performance of processing the sample window, wherein the dynamic performance prediction is provided prior to completion of a full processing run of the IC design;
   extrapolating, by using the one or more processors, the performance of the electronic automation tool for the full processing run based at least in part upon the dynamic performance prediction, wherein the processed sample window provides information for determining a configuration of the plurality of two-dimensional layout windows to be used for parallel processing by the electronic design automation tool on the IC design;
   if the first layout window is determined to interact with the second layout window, processing the operation or rule on the first layout window, considering the design component within the halo; and
   storing the prediction in a volatile or non-volatile computer readable storage medium for use in the electronic design or in manufacturing of an electronic circuit corresponding to the electronic design or displaying the prediction on a display device.

42. The computer program product of claim 41, in which the halo is configured for the first layout window that will consider not just shapes within the boundaries of the first layout window, but also any additional layout objects that exist within the halo even if the layout objects appear outside of the first layout window.

43. The computer program product of claim 42, in which a halo distance is established to address one or more interaction distances for specific operations or rules that are to be performed for a given two-dimensional layout window.

44. The computer program product of claim 42, in which two or more of the two-dimensional layout windows correspond to different halo distances.

45. The computer program product of claim 42, in which a common halo distance is shared by two or more layout windows.

46. The computer program product of claim 41, in which the one of the plurality of two-dimensional layout windows includes a first physical component and another of the plurality of two-dimensional layout windows includes a second physical component, where the first and the second physical components have a same logical hierarchy.

47. A system for processing of an electronic design automation tool, comprising:
   a processor for:
   identifying operations or rules to be performed by the electronic design automation tool on an electronic design;
   analyzing the electronic design and the operations or rules to determine at least a portion of the electronic design that can be divided into a plurality of two-dimensional layout windows;
   dividing at least the portion into the plurality of two-dimensional layout windows;
   determining a sample window for dynamic performance prediction, wherein the sample window instead of another sample window is selected for the dynamic performance prediction based at least in part upon a desired performance requirement;
   providing the dynamic performance prediction for predicting the performance of a full processing run of the electronic design by processing the sample window, wherein the dynamic performance prediction is provided prior to completion of the full processing run of the electronic design;
   extrapolating the performance of the electronic design automation tool for the full processing run based at least in part upon the dynamic performance prediction, wherein the processed sample window provides information for determining a configuration of the plurality of two-dimensional layout windows to be used for parallel processing by the electronic design automation tool on the electronic design; and
   a volatile or non-volatile computer readable storage medium for storing the performance for use in the electronic design or in manufacturing of an electronic circuit corresponding to the electronic design or a display device for displaying the performance.

48. The system of claim 47, in which the halo is configured for the first layout window that will consider not just shapes within the boundaries of the first layout window, but also any additional layout objects that exist within the halo even if the layout objects appear outside of the first layout window.

49. The system of claim 48, in which a halo distance is established to address one or more interaction distances for specific operations or rules that are to be performed for a given two-dimensional layout window.

50. The system of claim 48, in which two or more of the two-dimensional layout windows correspond to different halo distances.

51. The system of claim 48, in which a common halo distance is shared by two or more layout windows.

52. The system of claim 47, wherein the processor is further adapted for:

checking expected performance of the configuration of the plurality of two-dimensional layout windows;

determining if suitable performance is provided by the configuration of the plurality of two-dimensional layout windows; and adjusting the configuration of the plurality of two-dimensional layout windows if the expected performance is not adequate.

53. The system of claim 47, in which the one of the plurality of two-dimensional layout windows includes a first physical component and another of the plurality of two-dimensional layout windows includes a second physical component, where the first and the second physical components have a same logical hierarchy.

54. A computer program product comprising a volatile or non-volatile computer usable medium having executable code to execute a process by a processor for processing of an electronic design automation tool, the process comprising:

identifying operations or rules to be performed by the electronic design automation tool on an electronic design;

analyzing the electronic design and the operations or rules to determine at least a portion of the electronic design that can be divided into a plurality of two-dimensional layout windows;

dividing at least the portion into the plurality of two-dimensional layout windows;

determining a sample window for dynamic performance prediction, wherein the sample window instead of another sample window is selected for the dynamic performance prediction based at least in part upon a desired performance requirement;

providing the dynamic performance prediction for predicting the performance of a full processing run of the electronic design by processing the sample window, wherein the dynamic performance prediction is provided prior to completion of the full processing run of the electronic design;

extrapolating, by using the processor, the performance of the electronic design automation tool for the full processing run based at least in part upon the dynamic performance prediction, wherein the processed sample window provides information for determining a configuration of the plurality of two-dimensional layout windows to be used for parallel processing by the electronic design automation tool on the electronic design; and storing the performance in a volatile or non-volatile computer readable storage medium for use in the electronic design or in manufacturing of an electronic circuit corresponding to the electronic design or displaying the performance on a display device.

55. The computer program product of claim 54, in which the halo is configured for the first layout window that will consider not just shapes within the boundaries of the first layout window, but also any additional layout objects that exist within the halo even if the layout objects appear outside of the first layout window.

56. The computer program product of claim 55, in which a halo distance is established to address one or more interaction distances for specific operations or rules that are to be performed for a given two-dimensional layout window.

57. The computer program product of claim 55, in which two or more of the two-dimensional layout windows correspond to different halo distances.

58. The computer program product of claim 55, in which a common halo distance is shared by two or more layout windows.

59. The computer program product of claim 54, in which the process further comprises:

checking expected performance of the configuration of the plurality of two-dimensional layout windows;

determining if suitable performance is provided by the configuration of the plurality of two-dimensional layout windows; and adjusting the configuration of the plurality of two-dimensional layout windows if the expected performance is not adequate.

60. The computer program product of claim 54, in which the one of the plurality of two-dimensional layout windows includes a first physical component and another of the plurality of two-dimensional layout windows includes a second physical component, where the first and the second physical components have a same logical hierarchy.

* * * * *